United States Patent
Tseng et al.

(10) Patent No.: US 8,860,651 B2
(45) Date of Patent: Oct. 14, 2014

(54) DISPLAY PANEL AND GATE DRIVER THEREIN

(75) Inventors: Chien-Chang Tseng, Hsin-Chu (TW);
Kuang-Hsiang Liu, Hsin-Chu (TW);
Yu-Hsin Ting, Hsin-Chu (TW);
Shih-Hsiang Chou, Hsin-Chu (TW);
Ting-Jui Chang, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 145 days.

(21) Appl. No.: 13/458,465

(22) Filed: Apr. 27, 2012

(65) Prior Publication Data

US 2013/0135284 A1    May 30, 2013

(30) Foreign Application Priority Data

Nov. 30, 2011 (TW) .............................. 100144053 A

(51) Int. Cl.
*G09G 3/36* (2006.01)

(52) U.S. Cl.
USPC ........................................... 345/100; 377/64

(58) Field of Classification Search
CPC ............. G09G 3/36; G09G 3/38; H03K 5/22; G11C 19/00
See application file for complete search history.

(56) References Cited

U.S. PATENT DOCUMENTS

| | | | | |
|---|---|---|---|---|
| 8,023,613 | B2 * | 9/2011 | Tsai et al. | 377/79 |
| 8,339,424 | B2 * | 12/2012 | Jeong et al. | 345/690 |
| 8,411,017 | B2 * | 4/2013 | Hsu et al. | 345/100 |
| 8,462,096 | B2 * | 6/2013 | Otose | 345/100 |
| 2006/0269038 | A1 | 11/2006 | Jang et al. | |
| 2010/0207928 | A1 | 8/2010 | Lee et al. | |
| 2013/0100007 | A1 * | 4/2013 | Yamamoto et al. | 345/100 |
| 2013/0173870 | A1 * | 7/2013 | Tseng et al. | 711/154 |
| 2013/0222357 | A1 * | 8/2013 | Tseng et al. | 345/212 |

* cited by examiner

*Primary Examiner* — Chanh Nguyen
*Assistant Examiner* — Yuzhen Shen
(74) *Attorney, Agent, or Firm* — WPAT, PC; Justin King

(57) ABSTRACT

A gate driver includes cascade-connected driving stages. Each of the driving stages includes a first shift register circuit and a second shift register circuit. The first shift register circuit is configured for outputting a present stage driving signal and a next stage driving signal. The second shift register circuit is electrically coupled to the first shift register circuit and configured for outputting a present stage gate signal, a first next stage gate signal, and a second next stage gate signal. Furthermore, a display panel is also provided herein.

18 Claims, 14 Drawing Sheets

US 8,860,651 B2

DISPLAY PANEL AND GATE DRIVER THEREIN

RELATED APPLICATIONS

This application claims priority to Taiwan Patent Application Serial Number 100144053, filed Nov. 30, 2011, which is herein incorporated by reference.

BACKGROUND

1. Technical Field

The present disclosure relates to a display panel. More particularly, the present disclosure relates to a gate driver in a display panel 2. Description of Related Art In recent years, a liquid crystal display (LCD) has been commonly used as a display device because of its capability of displaying images with high quality while using little power consumption.

For the LCD, a display panel of the LCD is driven by a driver circuit, and the driver circuit includes a gate driver circuit and a source driver circuit, in which the gate driver circuit generates gate signals sequentially transmitted on gate lines, thereby sequentially activating pixel units row by row, and the source driver circuit generates data signals transmitted through data lines to the pixel units, such that images can be displayed on the display panel.

The aforementioned gate driver circuit may be implemented by various types of circuit, in which one of those types of circuits is implemented in a form of gate driver on array (GOA) on the display panel, i.e., the gate driver circuit is formed on a glass substrate of the LCD panel. In such type of gate driver circuit, devices (e.g., transistor switch) can be made of a material such as amorphous silicon (a-Si) or Indium-Gallium-Zinc Oxide (IGZO). However, when the devices made of the material such as amorphous silicon or Indium-Gallium-Zinc Oxide are utilized in the gate driver circuit, the devices usually operate with leakage currents, and thus an output signal has ripples therein. In other words, significant interference noises appear in the output signal and thus the power consumption increases. Moreover, if the ripples are desired to be reduced, an additional voltage stabilizing circuit has to be used to increase the capability of voltage stabilization. Nonetheless, more power consumption and circuit layout areas are needed. A typical gate driver circuit taken as an example is described below.

FIG. 1 is a circuit diagram illustrating a gate driver unit in a conventional gate driver. As shown in FIG. 1, in the condition that the gate driver unit 100 is activated, a transistor switch M1 operates according to an input signal IN1, such that a node Q has a corresponding voltage level, thus resulting in that a transistor switch M7 operates correspondingly and a gate signal G[N] is therefore generated and outputted to a gate line. Then, a voltage stabilizing circuit (e.g., transistor switches M5 and M6) stabilizes the outputted gate signal G[N].

However, when the gate driver unit 100 is activated, leakage currents are generated at the node Q by the transistor switches M5 and M6, e.g., a leakage current path is formed between the node Q and the transistor switch M1 due to device characteristics. Furthermore, when the gate driver unit 100 is deactivated, the transistor switches operate with a pre-determined voltage (e.g., Vgs=0 V). Since the transistor switches (e.g., M1-M7) are made of the material such as amorphous silicon or indium-Gallium-Zinc Oxide, the characteristic of the device itself causes the leakage current to become large, such that the ripple effect is significant and the additional power consumption increases significantly.

SUMMARY

A gate driver of one embodiment comprises a plurality of cascade-connected driving stages. Each of the driving stages comprises a first shift register circuit and a second shift register circuit electrically coupled to the first shift register circuit. The first shift register circuit comprises a first input unit, a first drive output unit and a second drive output unit. The first input unit is configured for outputting a first control signal according to a previous stage driving signal. The first drive output unit is configured for outputting a present stage driving signal according to the first control signal and a first driving clock signal. The second drive output unit is configured for outputting a next stage driving signal according to the first control signal and a second driving clock signal. The second shift register circuit comprises a second input unit and a first output unit. The second input unit is configured for outputting a second control signal according to the previous stage driving signal. The first output unit is configured for outputting a present stage gate signal according to the second control signal and a first gate clock signal.

A display panel of one embodiment comprises a plurality of data lines, a plurality of gate lines interlacing with the data lines, and a gate driver. The gate driver is coupled to the gate lines and configured for outputting a plurality of gate signals sequentially to the gate lines, in which the gate driver comprises a plurality of cascade-connected driving stages, and each of the driving stages comprises a first input unit, a first switch, a second switch, a second input unit, a third switch, a first pull-down unit, and a second pull-down unit. The first input unit is configured for electrically coupling a power voltage to a first control signal output terminal according to a previous stage driving signal or for electrically coupling a first reference voltage to the first control signal output terminal according to a next stage driving signal. The first switch is configured for outputting a first driving clock signal as a present stage driving signal according to a voltage level of the first control signal output terminal. The second switch is configured for outputting a second driving clock signal as a second next stage driving signal according to the voltage level of the first control signal output terminal. The second input unit is configured for electrically coupling the power voltage to a second control signal output terminal according to the previous stage driving signal or for electrically coupling the first reference voltage to the second control signal output terminal according to the next stage driving signal. The third switch is configured for outputting a first gate clock signal as a present stage gate signal according to a voltage level of the second control signal output terminal. The first pull-down unit is configured for electrically coupling a present stage driving signal output terminal and a second next stage driving signal output terminal to a second reference voltage according to a pull-down control signal. The second pull-down unit is configured for electrically coupling a present stage gate signal output terminal, a first next stage gate signal output terminal and a second next stage gate signal output terminal to a third reference voltage according to the pull-down control signal. The third reference voltage is greater than the first reference voltage, and the second reference voltage is greater than the first reference voltage.

BRIEF DESCRIPTION OF THE DRAWINGS

The invention can be more fully understood by reading the following detailed description of the embodiments, with reference to the accompanying drawings as follows.

DESCRIPTION OF THE EMBODIMENTS

In the following description, specific details are presented to provide a thorough understanding of the embodiments of the present invention. Persons of ordinary skill in the relevant art will recognize, however, that the present invention can be practiced without one or more of the specific details, or in combination with other components. Well-known implementations or operations are not shown or described in detail to avoid obscuring aspects of various embodiments of the present invention.

The terms used in this specification generally have their ordinary meanings in the art and in the specific context where each term is used. The use of examples anywhere in this specification, including examples of any terms discussed herein, is illustrative only, and in no way limits the scope and meaning of the invention or of any exemplified term. Likewise, the present invention is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present invention. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

In the following description and claims, the terms "coupled" and "connected", along with their derivatives, may be used. In particular embodiments, "connected" and "coupled" may be used to indicate that two or more elements are in direct physical or electrical contact with each other, or may also mean that two or more elements may not be in direct contact with each other. "Coupled" may still be used to indicate that two or more elements cooperate or interact with each other.

Figure 1:
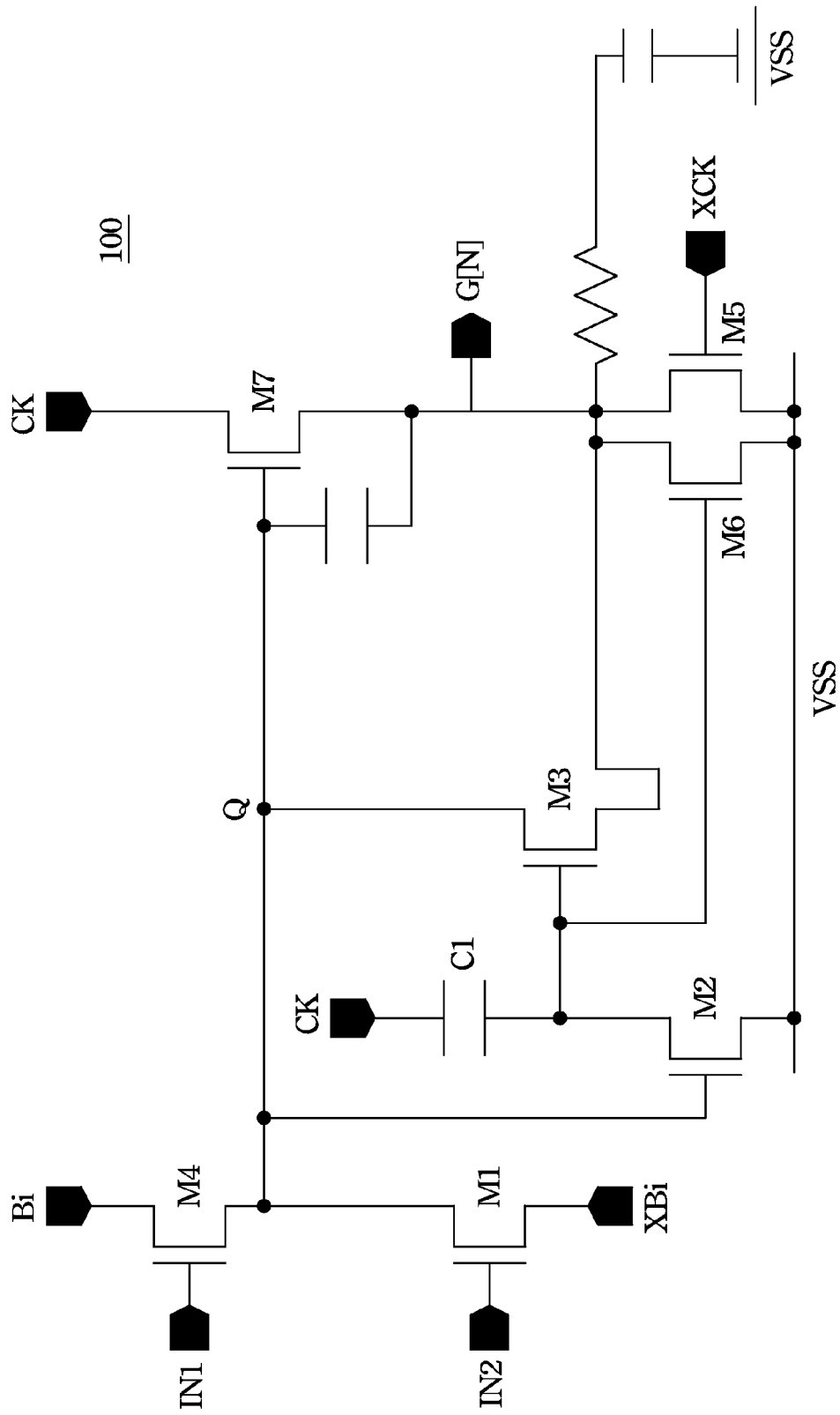
FIG. 1 is a circuit diagram illustrating a gate driver unit in a conventional gate driver.
Figure 2:
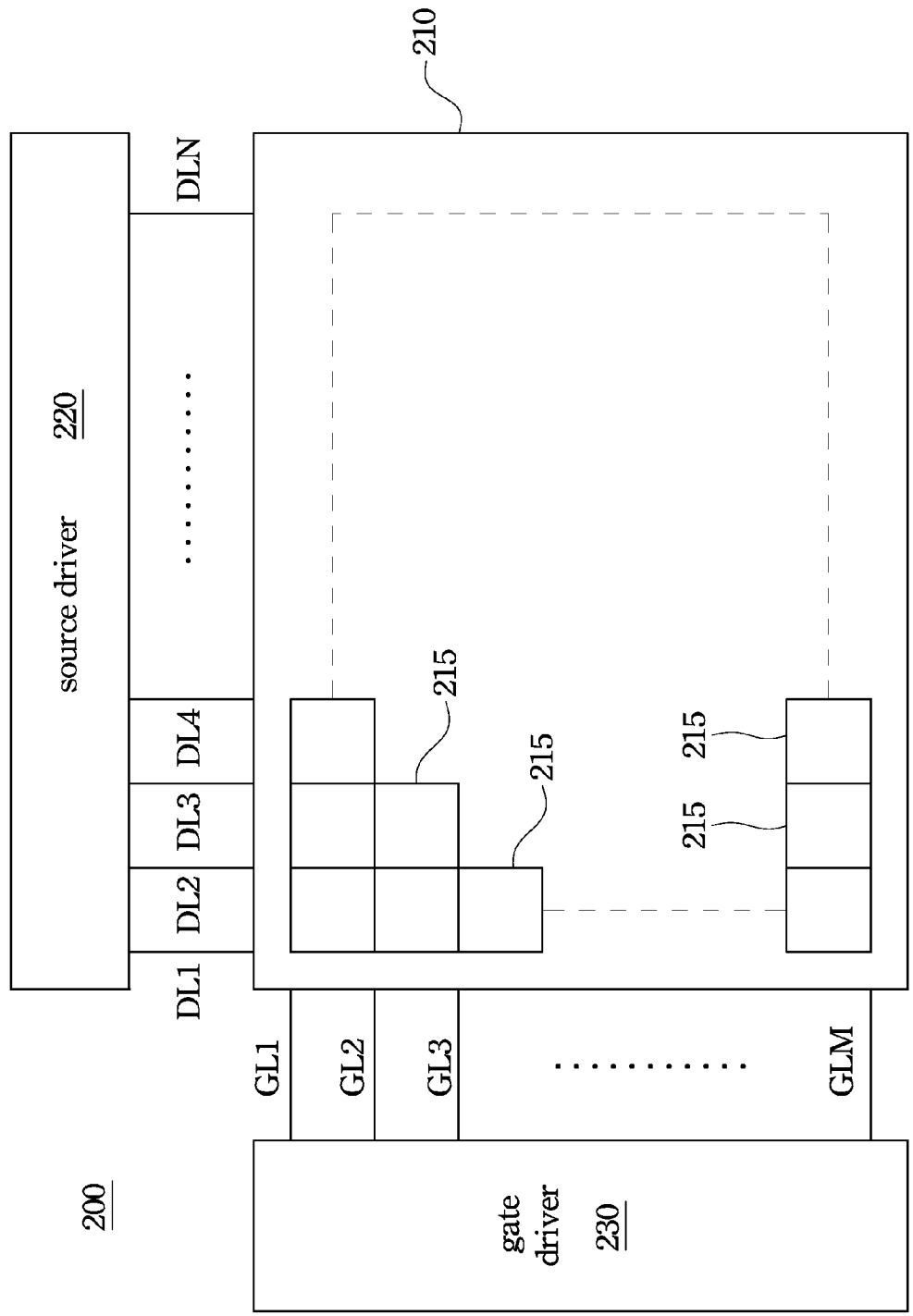
FIG. 2 is a diagram illustrating a display panel according to one embodiment of the present invention.

FIG. 2 is a diagram illustrating a display panel according to one embodiment of the present invention. The display panel 200 includes an image display area 210, a source driver 220 and a gate driver 230. The image display area 210 includes an array and a plurality of display pixels 215, in which the array is formed by a plurality of data lines (e.g., N data lines DL1-DLN, where N is a positive integer) interlacing with a plurality of gate lines (e.g., M gate lines GL1-GLM, where M is a positive integer), and the display pixels 215 are disposed in the array. The source driver 220 is coupled to the data lines DL1-DLN and configured for outputting data signals transmitted through the data lines DL1-DLN to the image display area 210. The gate driver 230 is coupled to the gate lines GL1-GLM and configured for outputting gate signals sequentially to the gate lines GL1-GLM and further to the image display area 210 through the gate lines GL1-GLM.

Figure 3:
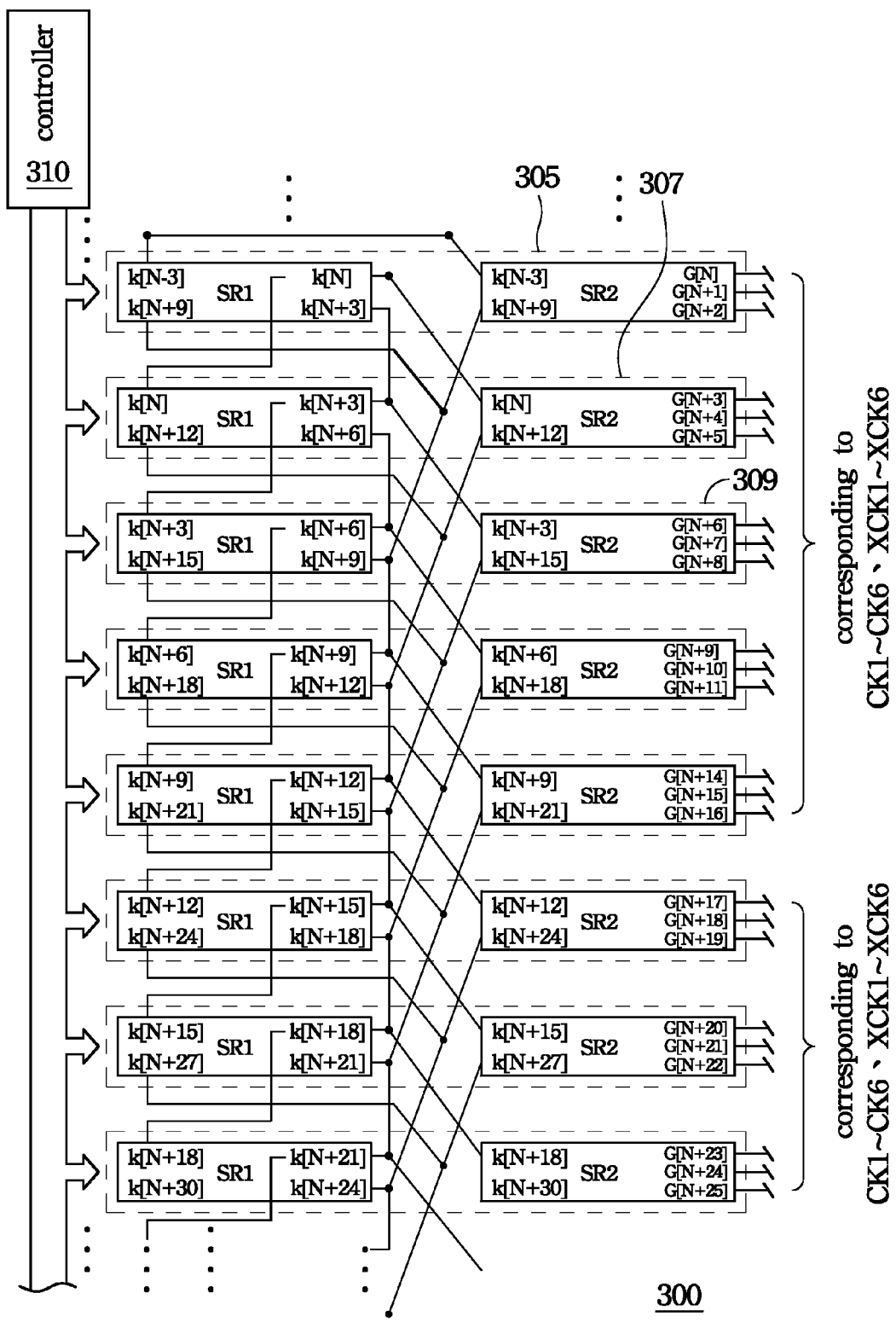
FIG. 3 is a diagram illustrating a gate driver according to one embodiment of the present invention.

FIG. 3 is a diagram illustrating a gate driver according to one embodiment of the present invention. The gate driver 300 is applicable to the display panel 200 shown in FIG. 2. The gate driver 300 includes a plurality of cascade-connected driving stages (e.g., a first driving stage 305, a second driving stage 307, a third driving stage 309, . . . ), and each of the driving stages includes a first shift register circuit SR1 and a second shift register circuit SR2, in which the first shift register circuit SR1 is configured for outputting a present stage driving signal and a next stage driving signal, and the second shift register circuit SR2 is configured for outputting a present stage gate signal and two next stage gate signals; in other words, each of the driving stages may output three gate signals sequentially to three gate lines, respectively.

For example, in regard to the first driving stage 305 in FIG. 3, the first shift register circuit SR1 outputs the present stage driving signal (e.g., N-th stage driving signal k[N]) and the next stage driving signal (e.g., (N+3)-th stage driving signal k[N+3]), and the second shift register circuit SR2 outputs the present stage gate signal (e.g., N-th stage gate signal G[N]) and two next stage gate signals (e.g., (N+1)-th stage gate signal G[N+1], and (N+2)-th stage gate signal G[N+2]); in other words, the first driving stage 305 may output the three gate signals G[N], G[N+1] and G[N+2] sequentially to the three gate lines, respectively.

Moreover, the driving signal k[N] outputted by the first driving stage 305 is also configured for driving the second shift register circuit SR2 of the second driving stage 307, and the driving signal k[N+3] outputted by the first driving stage 305 together with the second driving stage 307 (or shared by the first driving stage 305 and the second driving stage 307) is configured for driving the second shift register circuit SR2 of the third driving stage 309. The second shift register circuit SR2 of the first driving stage 305 is configured for receiving a previous stage driving signal (e.g., (N−3)-th stage driving signal k[N−3]) and a next stage driving signal (e.g., (N+9)-th stage driving signal k[N+9]), such that the second shift register circuit SR2 operates accordingly.

Furthermore, the display panel may include a controller 310, and the controller 310 can be fabricated in the gate driver 300 or outside the gate driver 300 and configured for providing required control signals or voltages such as clock signals (e.g., clock signals CK1-CK6, XCK1-XCK6, CCK1, CCK4, XCCK1, XCCK4), reference voltages (e.g., reference voltages Vss1, Vss2, Vss3), a start signal ST, etc., for operations of the gate driver 300.

Figure 4:
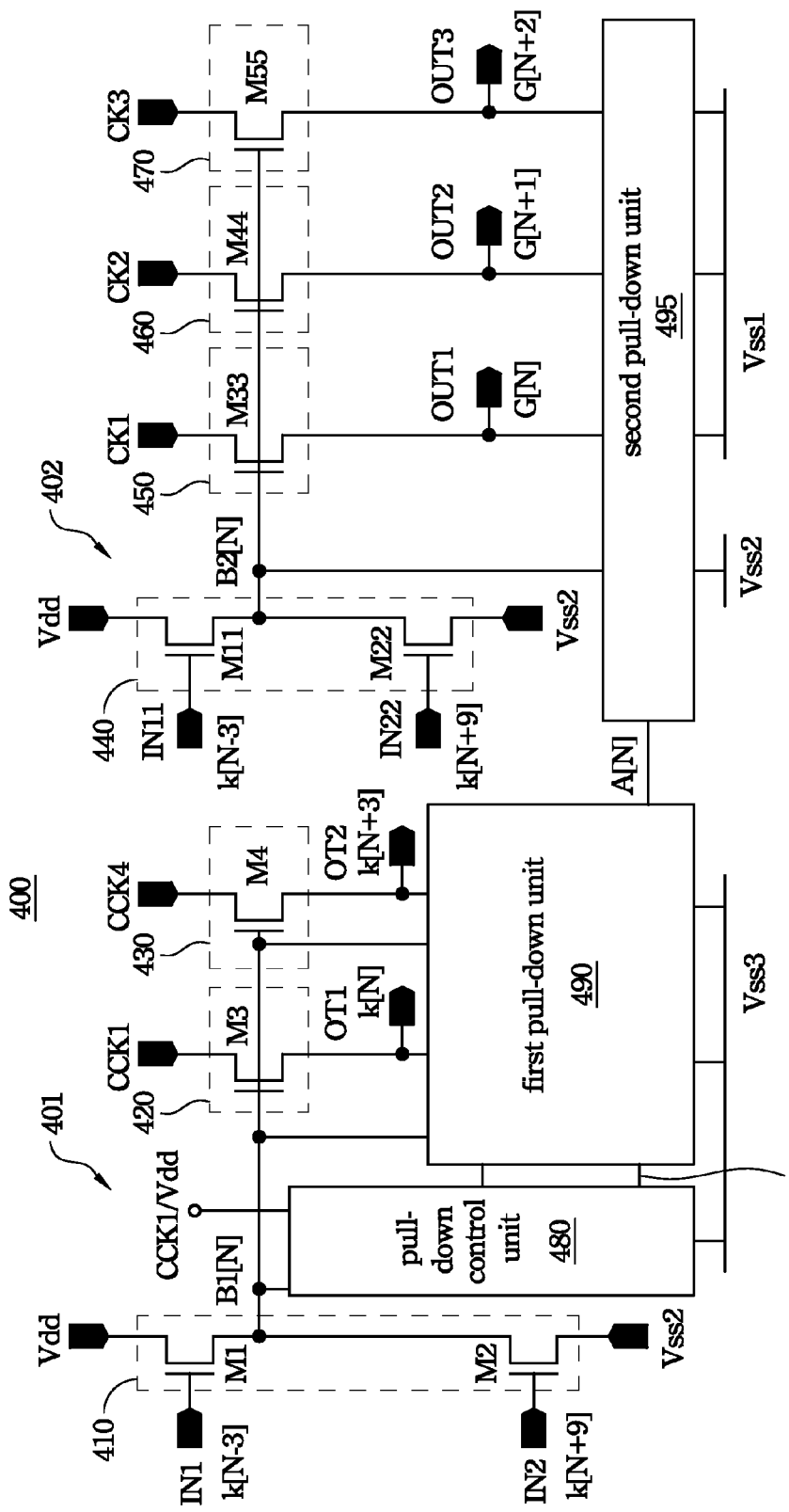
FIG. 4 is a circuit diagram illustrating a driving stage in a gate driver according to one embodiment of the present invention.

FIG. 4 is a circuit diagram illustrating a driving stage in a gate driver according to one embodiment of the present invention. The driving stage 400 is applicable to the gate driver 300 as shown in FIG. 3. For convenience of illustration, an N-th driving stage is described as an example below. The driving stage 400 includes a first shift register circuit 401 and a second shift register circuit 402, in which the second shift register circuit 402 is electrically coupled to the first shift register circuit 401.

The first shift register circuit 401 includes a first input unit 410, a first drive output unit 420 and a second drive output unit 430. The first input unit 410 is configured to be electrically coupled to a power voltage Vdd and the reference voltage Vss2, and has receiving terminals IN1, IN2 for receiving the previous stage driving signal k[N−3] and the next stage driving signal k[N+9], respectively, so as to output a control signal accordingly, such that a first control signal output terminal B1[N] has a corresponding voltage. The first drive output unit 420 is electrically coupled to the first input unit 410 at the first control signal output terminal B1[N] and configured for receiving a driving clock signal CCK1. The first drive output unit 420 operates according to the driving clock signal CCK1 and the control signal (representing the voltage of B1[N]) outputted by the first input unit 410, and outputs the present stage driving signal k[N] at a present stage driving signal output terminal OT1. The second drive output unit 430 is electrically coupled to the first input unit 410 at the first control signal output terminal B1[N] and configured for receiving a driving clock signal CCK4. The second drive output unit 430 operates according to the driving clock signal CCK4 and the control signal (representing the voltage of B1[N]) outputted by the first input unit 410, and outputs the next stage driving signal k[N+3] at a next stage driving signal output terminal OT2.

The second shift register circuit 402 includes a second input unit 440, a first output unit 450, a second output unit 460 and a third output unit 470. The second input unit 440 is configured to be electrically coupled to the power voltage Vdd and the reference voltage Vss2, and has receiving terminals IN11 and IN22 for receiving the previous stage driving signal k[N−3] and the next stage driving signal k[N+9], respectively, so as to output another control signal accordingly, such that a second control signal output terminal B2[N] has a corresponding voltage. The first output unit 450 is electrically coupled to the second input unit 440 at the second control signal output terminal B2[N] and configured for receiving a gate clock signal CK1. The first output unit 450 operates according to the gate clock signal CK1 and the control signal (representing the voltage of B2[N]) outputted by the second input unit 440, and outputs the present stage gate signal G[N] at a present stage gate signal output terminal OUT1. The second output unit 460 is electrically coupled to the second input unit 440 at the second control signal output terminal B2[N] and configured for receiving a gate clock signal CK2. The second output unit 460 operates according to the gate clock signal CK2 and the control signal (representing the voltage of B2[N]) outputted by the second input unit 440, and outputs the next stage gate signal G[N+1] at a next stage gate signal output terminal OUT2. The third output unit 470 is electrically coupled to the second input unit 440 at the second control signal output terminal B2[N] and configured for receiving a gate clock signal CK3. The third output unit 470 operates according to the gate clock signal CK3 and the control signal (representing the voltage of B2[N]) outputted by the second input unit 440, and outputs the next stage gate signal G[N+2] at another next stage gate signal output terminal OUT3.

In one embodiment, the first shift register circuit 401 may further include a pull-down control unit 480, and the pull-down control unit 480 is controlled with the control signal representing the voltage of B1[N], thereby outputting a pull-down control signal A[N] according to the driving clock signal CCK1 or the power voltage Vdd.

In another embodiment, the first shift register circuit 401 may further include a first pull-down unit 490. The first pull-down unit 490 is electrically coupled to the driving signal output terminals OT1 and OT2 and is activated according to the pull-down control signal A[N], for electrically coupling the driving signal output terminals OT1 and OT2 to the reference voltage Vss3, so as to stabilize the voltages of the driving signal output terminals OT1 and OT2.

In yet another embodiment, the second shift register circuit 402 may further include a second pull-down unit 495. The second pull-down unit 495 is electrically coupled to the gate signal output terminals OUT1, OUT2, OUT3 and is activated according to the pull-down control signal A[N], for electrically coupling the gate signal output terminals OUT1, OUT2, OUT3 to the reference voltage Vss1, so as to stabilize the voltages of the gate signal output terminals OUT1, OUT2, OUT3, in which the reference voltage Vss1 is greater than the reference voltage Vss3.

Figure 5:
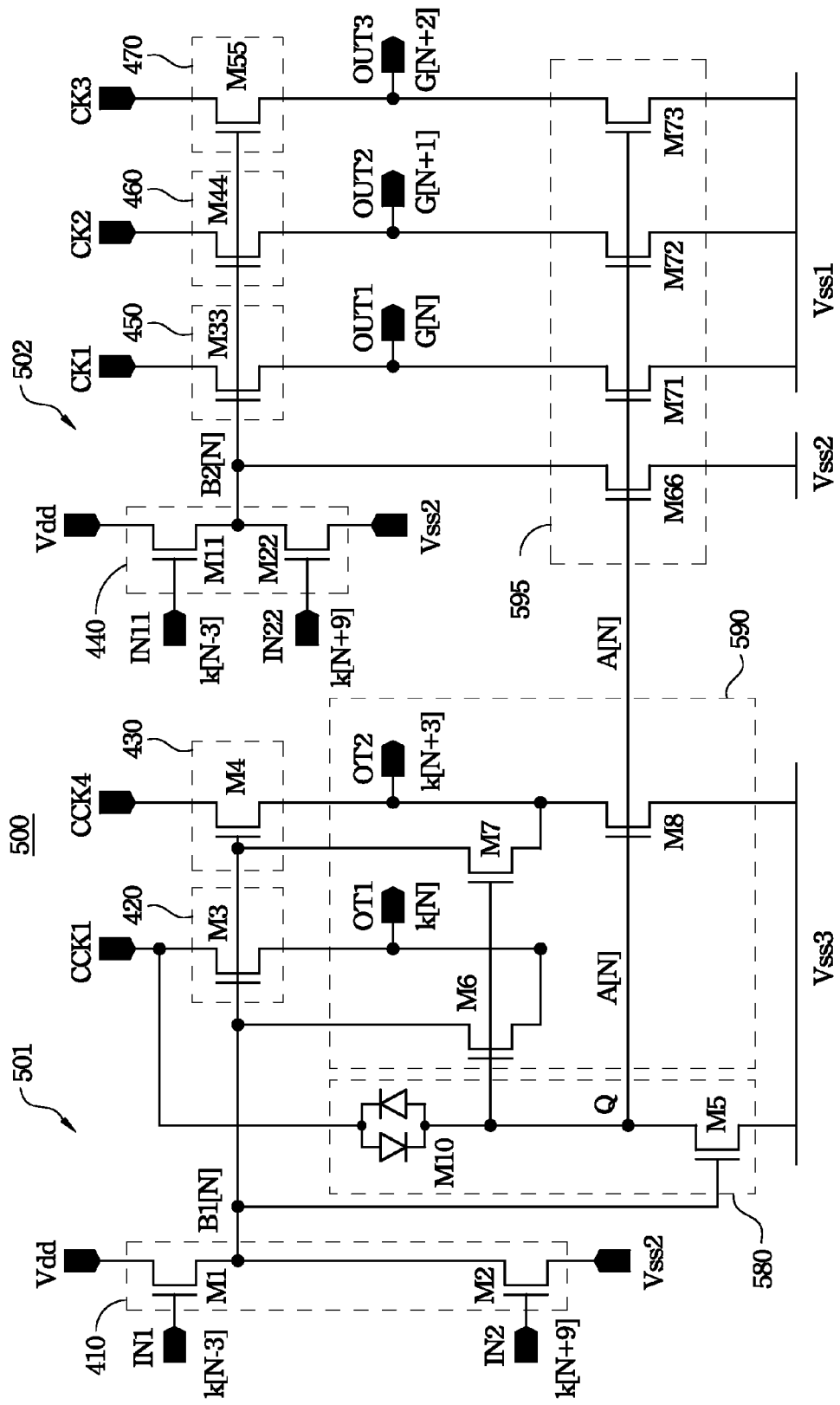
FIG. 5 is a circuit diagram illustrating a driving stage according to another embodiment of the present invention.

FIG. 5 is a circuit diagram illustrating a driving stage according to another embodiment of the present invention. The driving stage 500 is applicable to the gate driver 300 as shown in FIG. 3. The driving stage 500 includes a first shift register circuit 501 and a second shift register circuit 502, in which the second shift register circuit 502 is electrically coupled to the first shift register circuit 501.

The first shift register circuit 501 includes the first input unit 410, the first drive output unit 420, the second drive output unit 430, a pull-down control unit 580 and a first pull-down unit 590. The connections of operation of the first input unit 410, the first drive output unit 420, and the second drive output unit 430 are similar to those mentioned above, and thus are not described in further detail herein.

Compared to the embodiment as illustrated in FIG. 4, the pull-down control unit 580 in the embodiment as illustrated in FIG. 5 may further include a switch M5. A control end of the switch M5 is electrically coupled to the first control signal output terminal B1[N], one end of the switch M5, i.e., the node Q, is configured for receiving the driving clock signal CCK1 through a device M10, and the other end of the switch M5 is configured to be electrically coupled to the reference voltage Vss3. In operation, the switch M5 is controlled with the control signal representing the voltage of the first control signal output terminal B1[N]. When the voltage of B1[N] has a high level, the switch M5 is activated (or turned on) such that the node Q has a voltage level of the reference voltage Vss3, and the pull-down control signal A[N] is at a low level; when the voltage of B1[N] has a low level, the switch M5 is deactivated (or turned off) such that the driving clock signal CCK1 is transmitted through the pull-down control unit 580 and outputted as the pull-down control signal A[N].

Compared to the embodiment as illustrated in FIG. 4, the first pull-down unit 590 in the embodiment as illustrated in FIG. 5 may further include switches M6, M7 and M8. A control end of the switch M6 is electrically coupled to the switch M5 at the node Q, one end of the switch M6 is electrically coupled to the first control signal output terminal B1[N], and the other end of the switch M6 is electrically coupled to the present stage driving signal output terminal OT1, in which the switch M6 is activated according to the pull-down control signal A[N], for electrically coupling the first control signal output terminal B1[N] to the present stage driving signal output terminal OT1.

Moreover, a control end of the switch M7 is electrically coupled to the switch M5 at the node Q, one end of the switch M7 is electrically coupled to the first control signal output terminal B1[N], and the other end of the switch M7 is electrically coupled to the next stage driving signal output terminal OT2, in which the switch M7 is activated according to the pull-down control signal A[N], for electrically coupling the first control signal output terminal B1[N] to the next stage driving signal output terminal OT2.

Furthermore, a control end of the switch M8 is electrically coupled to the switch M5 at the node Q, one end of the switch M8 is electrically coupled to the next stage driving signal output terminal OT2, and the other end of the switch M8 is electrically coupled to the reference voltage Vss3, in which the switch M8 is activated according to the pull-down control signal A[N], for electrically coupling the next stage driving signal output terminal OT2 to the reference voltage Vss3.

Compared to the embodiment as illustrated in FIG. 4, the second pull-down unit 595 in the embodiment as illustrated in FIG. 5 may further include switches M71, M72, M73 and M66. A control end of the switch M71 is electrically coupled to the switch M5 at the node Q, one end of the switch M71 is electrically coupled to the present stage gate signal output terminal OUT1, and the other end of the switch M71 is electrically coupled to the reference voltage Vss1, in which the switch M71 is activated according to the pull-down control signal A[N], for electrically coupling the present stage gate signal output terminal OUT1 to the reference voltage Vss1. A control end of the switch M72 is electrically coupled to the switch M5 at the node Q, one end of the switch M72 is electrically coupled to the next stage gate signal output terminal OUT2, and the other end of the switch M72 is electrically coupled to the reference voltage Vss1, in which the switch M72 is activated according to the pull-down control signal A[N], for electrically coupling the next stage gate signal output terminal OUT2 to the reference voltage Vss1.

Moreover, a control end of the switch M73 is electrically coupled to the switch M5 at the node Q, one end of the switch M73 is electrically coupled to the next stage gate signal output terminal OUT3, and the other end of the switch M73 is electrically coupled to the reference voltage Vss1, in which the switch M73 is activated according to the pull-down control signal A[N], for electrically coupling the next stage gate signal output terminal OUT3 to the reference voltage Vss1. In addition, a control end of the switch M66 is electrically coupled to the switch M5 at the node Q, one end of the switch M66 is electrically coupled to the second control signal output terminal B2[N], and the other end of the switch M66 is electrically coupled to the reference voltage Vss2, in which the switch M66 is activated according to the pull-down control signal A[N], for electrically coupling the second control signal output terminal B2[N] to the reference voltage Vss2. The reference voltage Vss1 is greater than the reference voltage Vss2, and the reference voltage Vss2 is greater than the reference voltage Vss3.

In one embodiment, the first input unit 410 may further include switches M1 and M2, and the second input unit 440 may further include switches M11 and M22. A control end of the switch M1 is configured for receiving the previous stage driving signal k[N−3], one end of the switch M1 is configured to be electrically coupled to the power voltage Vdd, and the other end of the switch M1 is electrically coupled to the first control signal output terminal B1[N], in which the switch M1 is activated according to the previous stage driving signal k[N−3], for electrically coupling the power voltage Vdd to the first control signal output terminal B1[N]. A control end of the switch M2 is configured for receiving the next stage driving signal k[N+9], one end of the switch M2 is configured to be electrically coupled to the reference voltage Vss2, and the other end of the switch M2 is electrically coupled to the first control signal output terminal B1[N], in which the switch M2 is activated according to the next stage driving signal k[N+9], for electrically coupling the reference voltage Vss2 to the first control signal output terminal B1[N].

Similarly, a control end of the switch M11 is configured for receiving the previous stage driving signal k[N−3], one end of the switch M11 is configured to be electrically coupled to the power voltage Vdd, and the other end of the switch M11 is electrically coupled to the second control signal output terminal B2[N], in which the switch M11 is activated according to the previous stage driving signal k[N−3], for electrically coupling the power voltage Vdd to the second control signal output terminal B2[N]. A control end of the switch M22 is configured for receiving the next stage driving signal k[N+9], one end of the switch M22 is configured to be electrically coupled to the reference voltage Vss2, and the other end of the switch M22 is electrically coupled to the second control signal output terminal B2[N], in which the switch M22 is activated according to the next stage driving signal k[N+9], for electrically coupling the reference voltage Vss2 to the second control signal output terminal B2[N].

In another embodiment, the first drive output unit 420 may further include a switch M3, and the second drive output unit 430 may further include a switch M4. A control end of the switch M3 is electrically coupled to the first control signal output terminal B1[N], one end of the switch M3 is configured for receiving the driving clock signal CCK1, and the other end of the switch M3 is electrically coupled to the present stage driving signal output terminal OT1, in which the switch M3 is activated according to the control signal representing the voltage of B1[N], so as to output the driving clock signal CCK1 as the present stage driving signal k[N]. Moreover, a control end of the switch M4 is electrically coupled to the first control signal output terminal B1[N], one end of the switch M4 is configured for receiving the driving clock signal CCK4, and the other end of the switch M4 is electrically coupled to the next stage driving signal output terminal OT2, in which the switch M4 is activated according to the control signal representing the voltage of B1[N], so as to output the driving clock signal CCK4 as the next stage driving signal k[N+3].

In still another embodiment, the first output unit 450 may further include a switch M33, the second output unit 460 may further include a switch M44, and the third output unit 470 may further include a switch M55. A control end of the switch M33 is electrically coupled to the second control signal output terminal B2[N], one end of the switch M33 is configured for receiving the gate clock signal CK1, and the other end of the switch M33 is electrically coupled to the present stage gate signal output terminal OUT1, in which the switch M33 is activated according to the control signal representing the voltage of B2[N], so as to output the gate clock signal CK1 as the present stage gate signal G[N]. Furthermore, a control end of the switch M44 is electrically coupled to the second control signal output terminal B2[N], one end of the switch M44 is configured for receiving the gate clock signal CK2, and the other end of the switch M44 is electrically coupled to the next stage gate signal output terminal OUT2, in which the switch M44 is activated according to the control signal representing the voltage of B2[N], so as to output the gate clock signal CK2 as the next stage gate signal G[N+1]. In addition, a control end of the switch M55 is electrically coupled to the second control signal output terminal B2[N], one end of the switch M55 is configured for receiving the gate clock signal CK3, and the other end of the switch M55 is electrically coupled to the next stage gate signal output terminal OUT3, in which the switch M55 is activated according to the control signal representing the voltage of B2[N], so as to output the gate clock signal CK3 as another next stage gate signal G[N+2]. Therefore, a plurality of gate signals can be outputted by a single driving stage; for example, three gate signals G[N], G[N+1] and G[N+2] are outputted and transmitted sequentially to three gate lines, so as to reduce the number of the required driving stages.

In practice, the aforementioned switches can be separately implemented by various types of switches such as an analog switch, a digital switch, a transistor switch, a thin-film transistor (TFT) switch, etc.

Figure 6A:
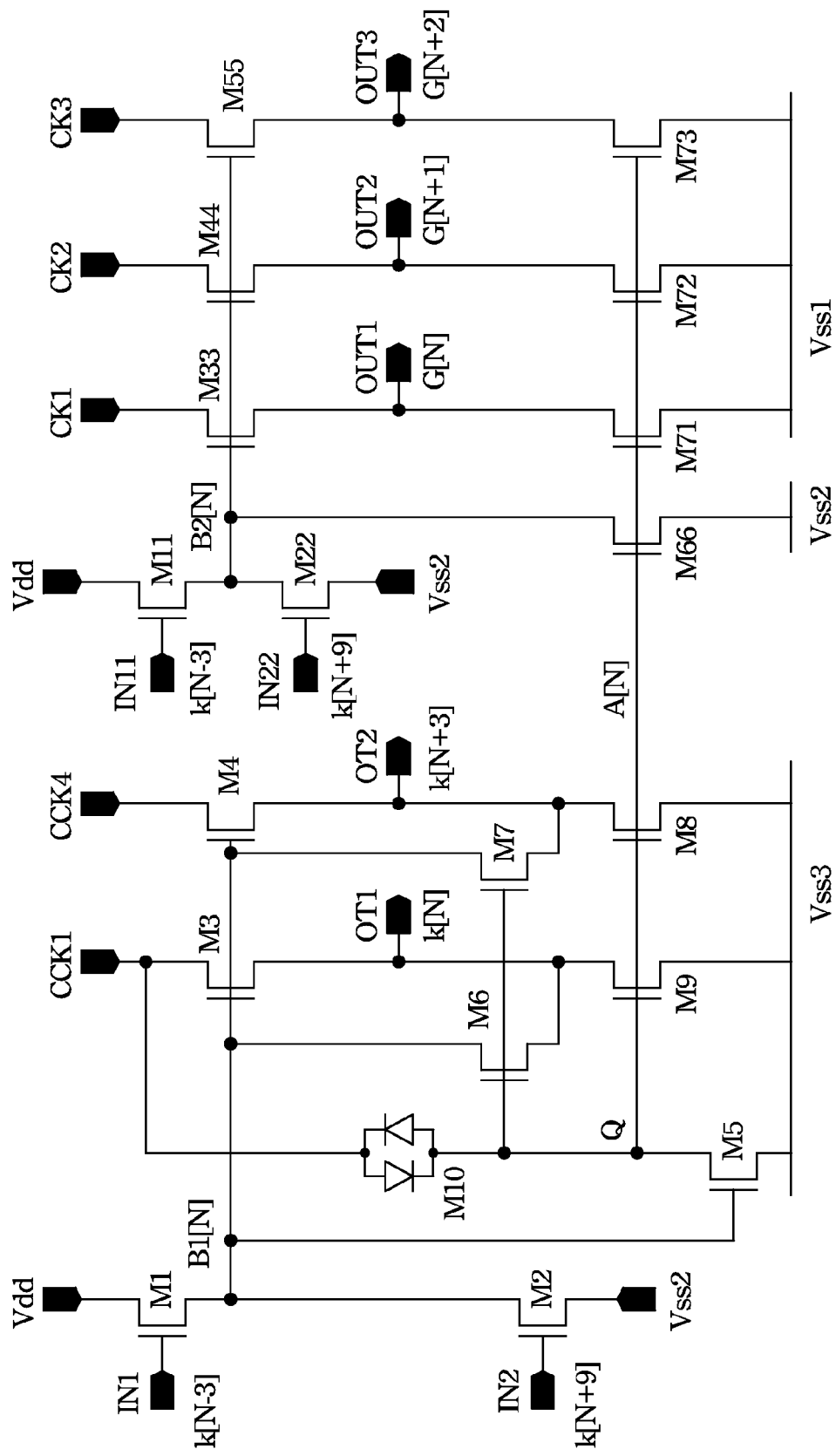
FIG. 6A-FIG. 6D are circuit diagrams illustrating driving stages according to embodiments of the present invention.
Figure 6B:
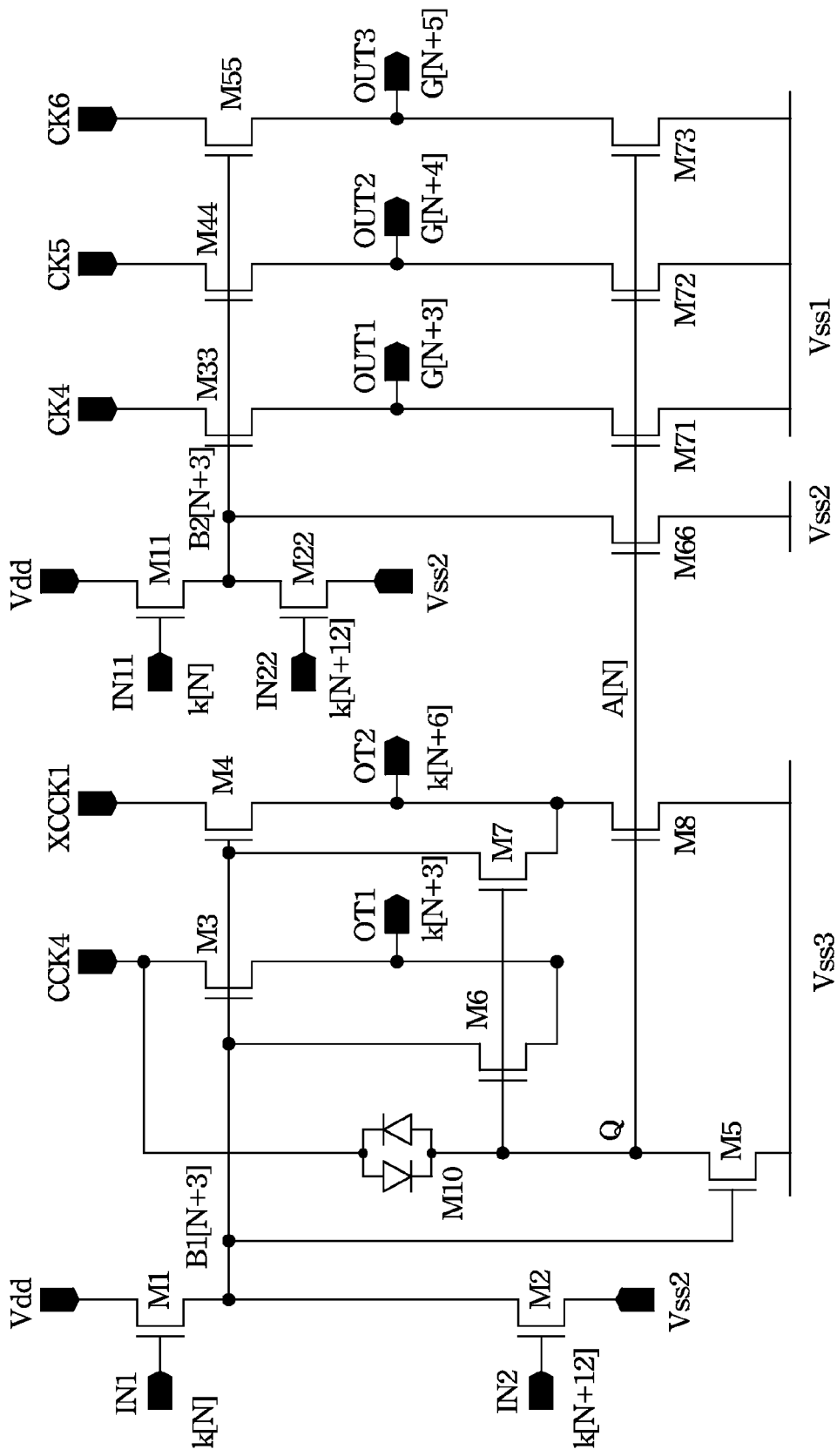
Figure 6C:
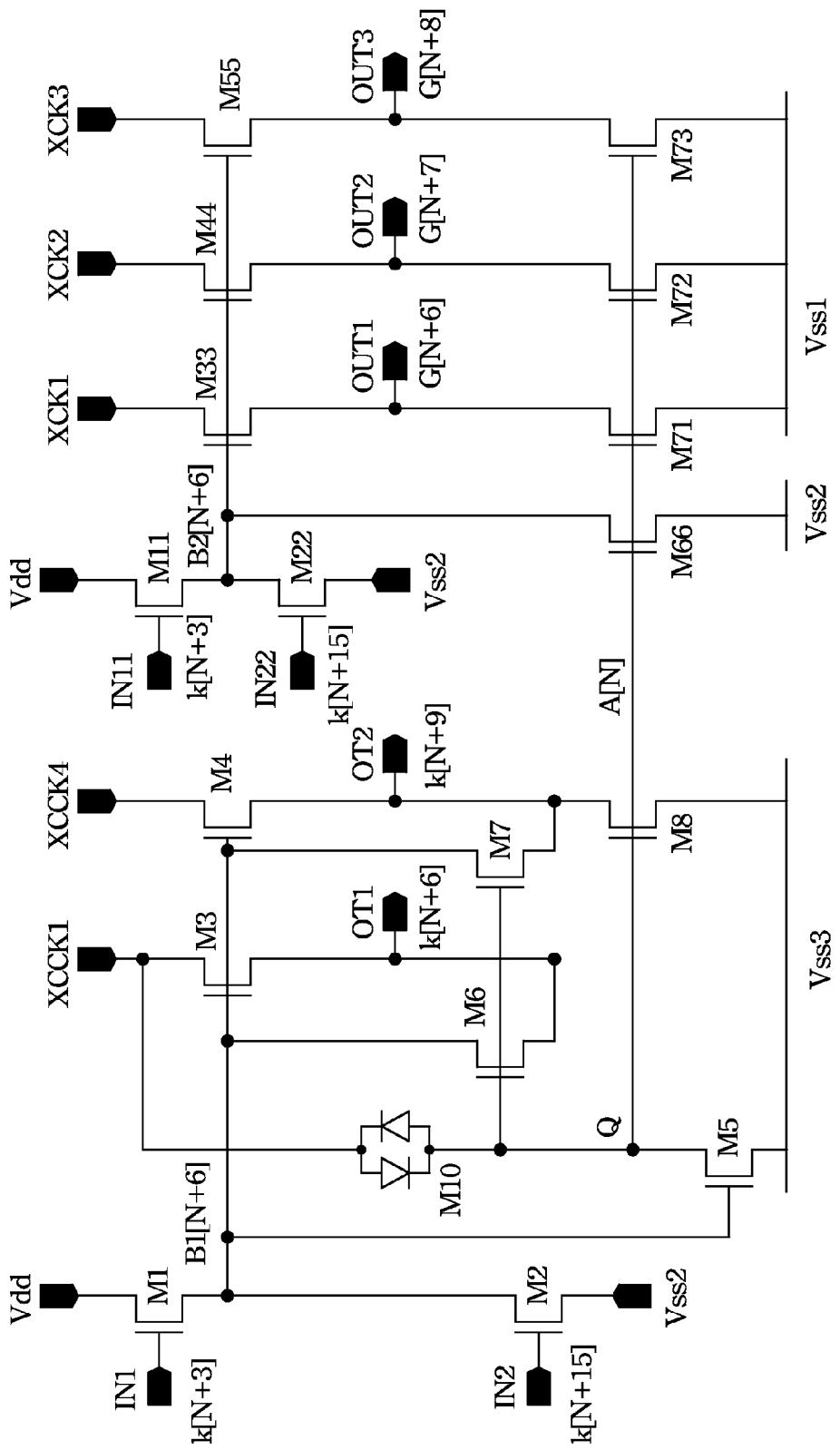
Figure 6D:
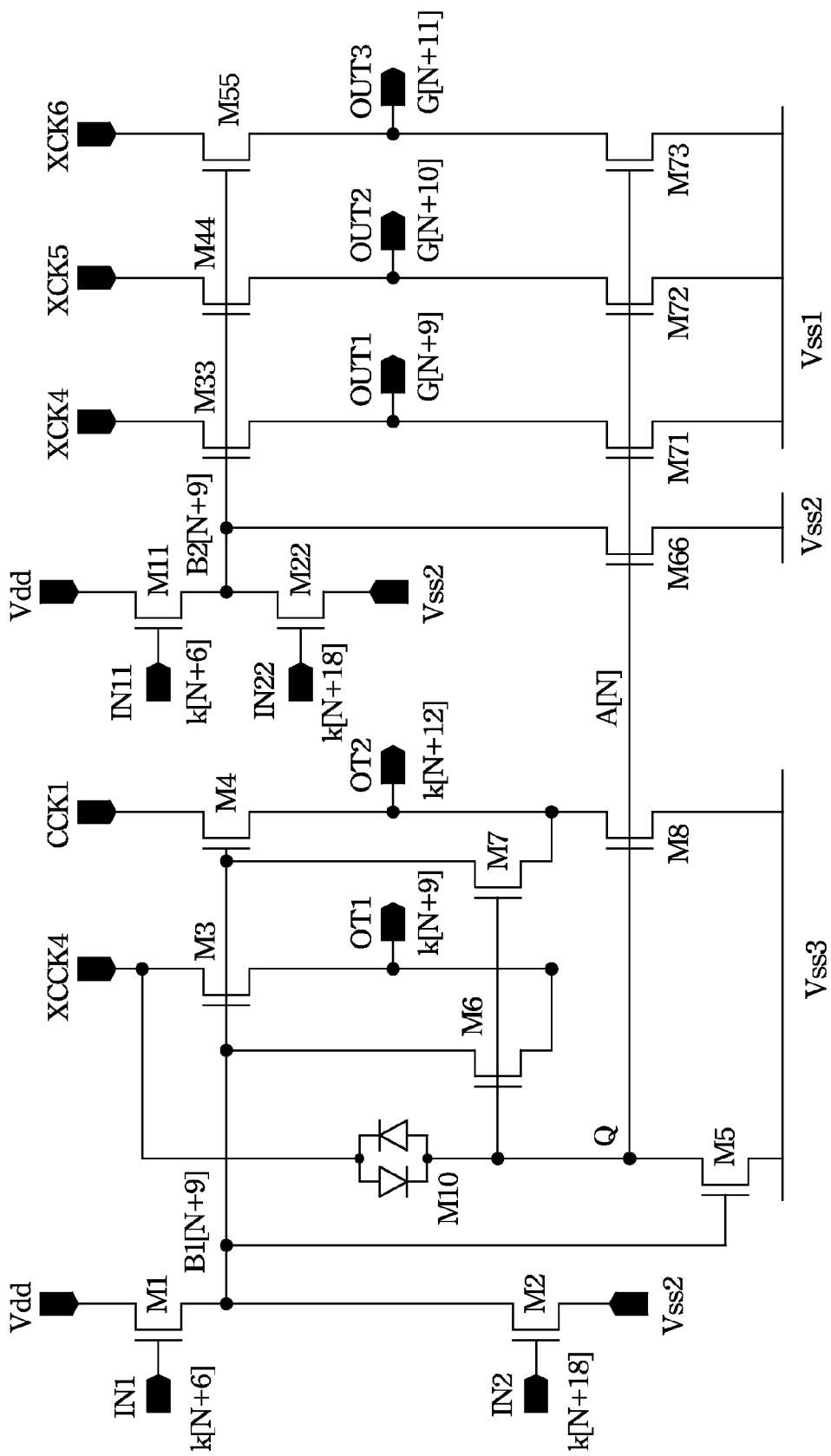

FIG. 6A-FIG. 6D are circuit diagrams illustrating driving stages according to embodiments of the present invention. As shown in FIG. 6A-FIG. 6D, the first driving stage through the fourth driving stage are electrically coupled in cascade and separately operate according to the corresponding clock signals and the driving signals. Specifically, the first driving stage shown in FIG. 6A is configured for receiving the driving signals k[N−3], k[N+9], the gate clock signals CK1, CK2, CK3, and the driving clock signals CCK1, CCK4, and the first driving stage accordingly outputs the driving signals k[N], k[N+3] and the gate signals G[N], G[N+1], G[N+2]. The second driving stage shown in FIG. 6B is configured for receiving the driving signals k[N], k[N+12], the gate clock signals CK4, CK5, CK6, and the driving clock signals CCK4, XCCK1, and the second driving stage accordingly outputs the driving signals k[N+3], k[N+6] and the gate signals G[N+3], G[N+4], G[N+5]. The third driving stage shown in FIG. 6C is configured for receiving the driving signals k[N+3], k[N+15], the gate clock signals XCK1, XCK2, XCK3, and the driving clock signals XCCK1, XCCK4, and the third driving stage accordingly outputs the driving signals k[N+6], k[N+9] and the gate signals G[N+6], G[N+7], G[N+8]. The fourth driving stage shown in FIG. 6D is configured for receiving the driving signals k[N+6], k[N+18], the gate clock signals XCK4, XCK5, XCK6, and the driving clock signals XCCK4, CCK1, and the fourth driving stage accordingly outputs the driving signals k[N+9], k[N+12] and the gate signals G[N+9], G[N+10], G[N+11].

Figure 7:
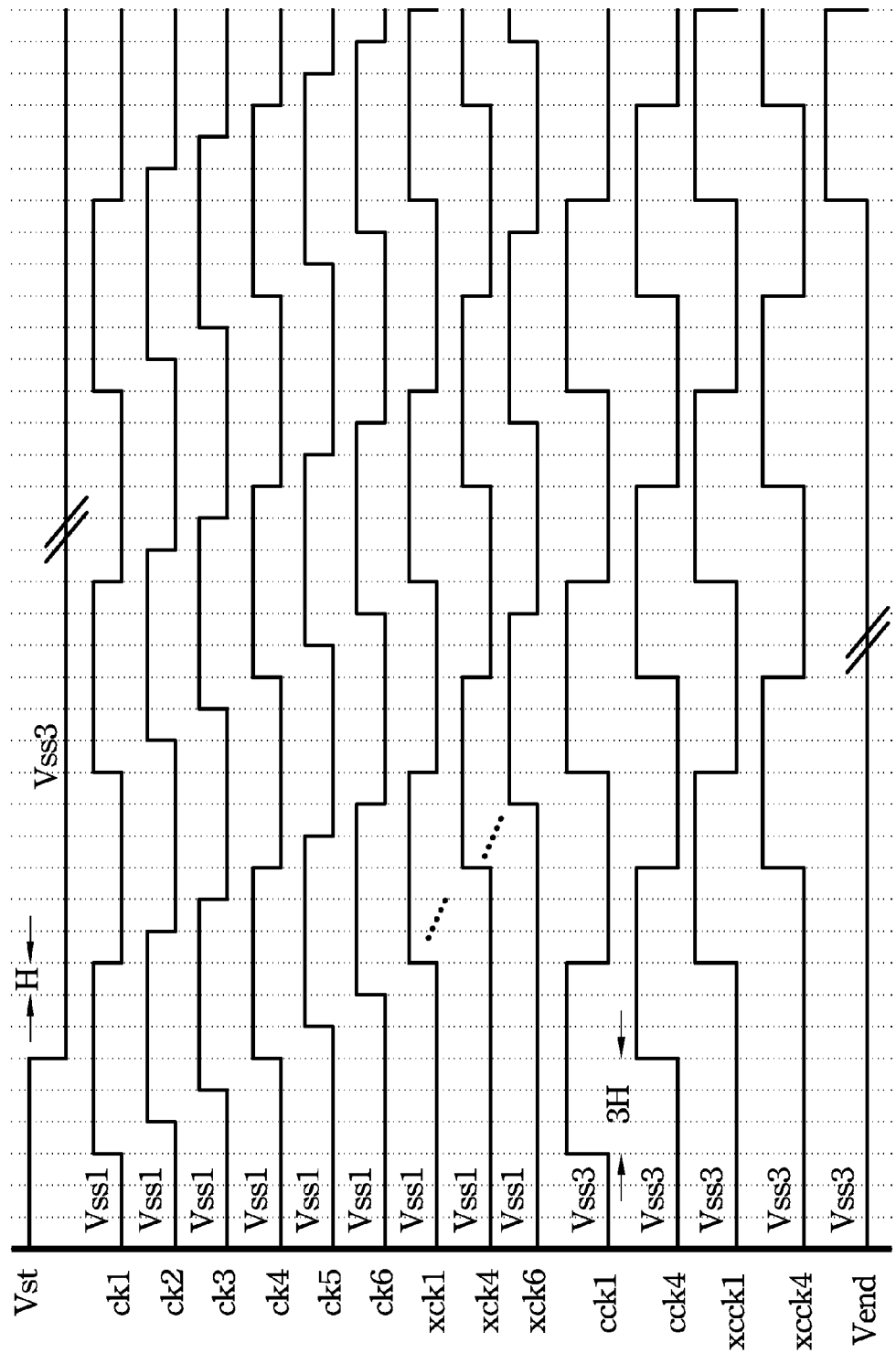
FIG. 7 is a timing diagram illustrating control signals according to one embodiment of the present invention.

FIG. 7 is a timing diagram illustrating control signals according to one embodiment of the present invention. As shown in FIG. 7, the signals Vst and Vend are a start signal and an end signal respectively for separately activating the first driving stage and deactivating the last driving stage. Furthermore, the gate clock signals CK1-CK6 have different phases from one another, in which every two successive gate clock signals of the gate clock signals CK1-CK6 have a phase difference of a period H (i.e., a one-twelfth of a duty cycle of the clock signal); the gate clock signals XCK1-XCK6 have different phases from one another, in which every two successive gate clock signals of the gate clock signals XCK1-XCK6 have a phase difference of the period H, and the gate clock signals CK1-CK6 are opposite to the gate clock signals XCK1-XCK6 in phase, respectively. In addition, the driving clock signals CCK1 and CCK4 have a phase difference of a period 3H (i.e., one-quarter of a duty cycle of the clock signal), and the driving clock signals XCCK1 and XCCK4 have a phase difference of the period 3H, and the driving clock signals CCK1 and CCK4 are opposite to the driving clock signals XCCK1 and XCCK4 in phase, respectively, in which the signals CCK1 and CK1 have the same phase, the signals CCK4 and CK4 have the same phase, the signals XCCK1 and XCK1 have the same phase, and the signals XCCK4 and XCK4 have the same phase.

Moreover, the gate clock signals CK1-CK6 and XCK1-XCK6 have a low voltage level of the reference voltage Vss1, and the gate clock signals CK1-CK6 and XCK1-XCK6 have a high voltage level of the power voltage Vdd, and the driving clock signals CCK1, CCK4, XCCK1 and XCCK4 have a low voltage level of the reference voltage Vss3, and the driving clock signals CCK1, CCK4, XCCK1 and XCCK4 have a high voltage level of the power voltage Vdd, in which the reference voltage Vss1 is greater than the reference voltage Vss3.

On the other hand, referring to FIG. 6A-FIG. 6D, the circuit of each driving stage can be similar to the circuit as shown in FIG. 5, and the driving stage can be implemented by the first driving stage (as shown in FIG. 6A) only if the driving stage is a start driving stage. Specifically, in the condition that the first driving stage is the start driving stage, the first shift register circuit in the first driving stage may further include a switch M9 (as shown in FIG. 6A), in which a control end of the switch M9 is electrically coupled to the switch M5 at the node Q, one end of the switch M9 is electrically coupled to the present stage driving signal output terminal OT1, and the other end of the switch M9 is configured to be electrically coupled to the reference voltage Vss3, in which the switch M9 is activated according to the pull-down control signal A[N], for electrically coupling the present stage driving signal output terminal OT1 to the reference voltage Vss3. On the other hand, in the first driving stage, the next stage driving signal output terminal OT2 for outputting the next stage driving signal k[N+3] can be voltage stabilized by the switch M8, and thus the output terminal OT1 for outputting the next stage driving signal k[N+3], as shown in the second driving stage in FIG. 6B, can be voltage stabilized by the switch M8 in the first driving stage such that the effect of voltage stabilization can be achieved as well, and the rest of the driving stages may be deduced by analogy.

Figure 8:
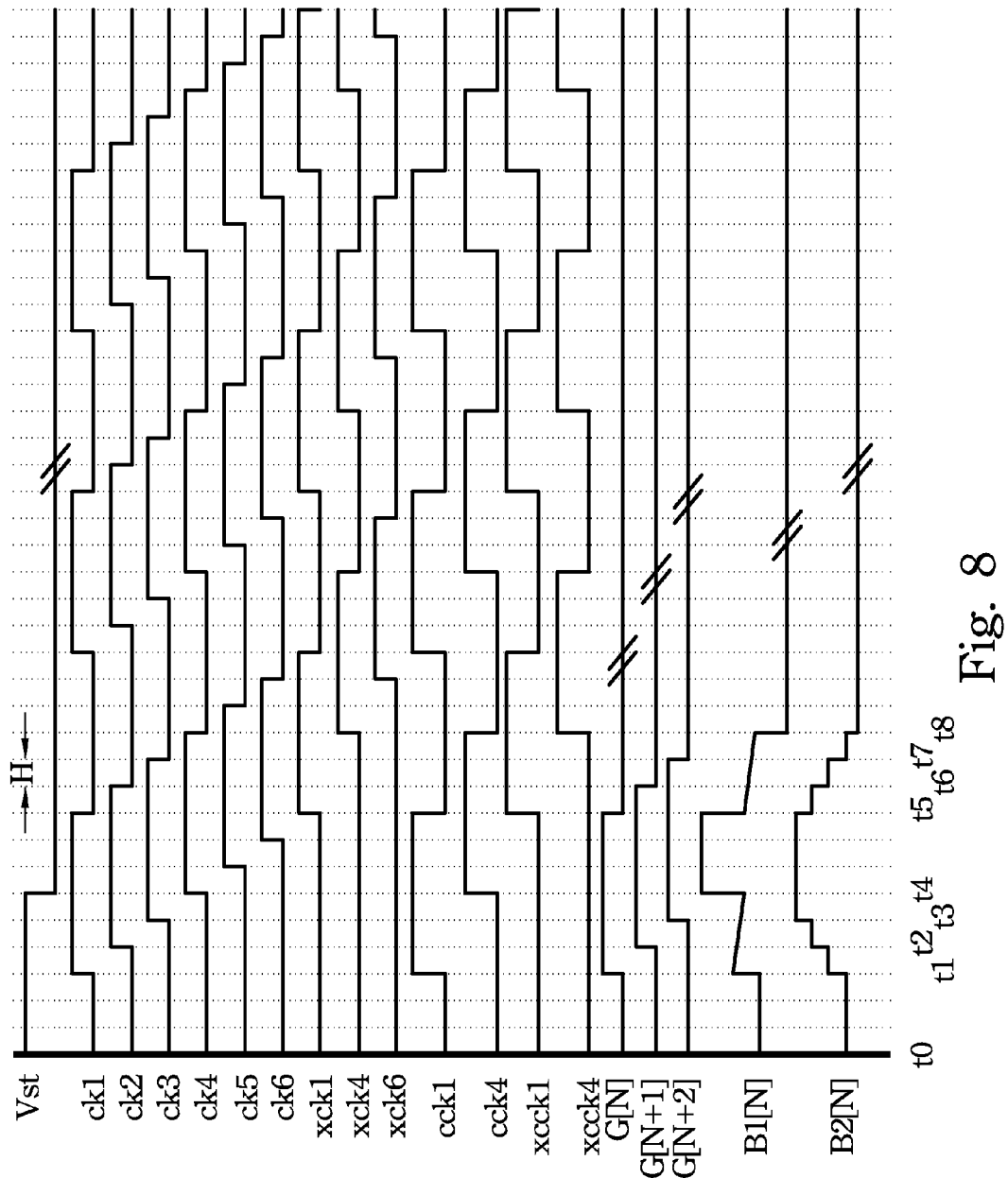
FIG. 8 is a timing diagram of the operation of the driving stage as shown in FIG. 5 according to one embodiment of the present invention.

The operation of the driving stage is described below in conjunction with one embodiment of the present invention. FIG. 8 is a timing diagram of the operation of the driving stage as shown in FIG. 5 according to one embodiment of the present invention. The next descriptions are made with reference to FIG. 5 and FIG. 8.

At time t0, the switches M1 and M11 receive the previous stage driving signal k[N−3] to be activated, such that the power voltage Vdd charges the terminals B1[N] and B2[N] through the switches M1 and M11, respectively, resulting in that the voltages of the terminals B1[N] and B2[N] increase to a predetermined voltage. The switches M3, M4, M33, M44 and M55 are activated accordingly, and the switch M5 is accordingly activated as well to pull down the voltage of the node Q to the reference voltage Vss3, such that the switches M6, M7, M8, M66, M71, M72 and M73 are deactivated.

The voltage of the node Q is pulled down to the reference voltage Vss3, one end of the switch M66 is coupled to the reference voltage Vss2, one ends of the switches M71, M72, M73 are coupled to the reference voltage Vss1, and the reference voltage Vss3 is less than the reference voltages Vss2 and Vss1. Therefore, when the second shift register circuit 502 operates, the switches M66, M71, M72, M73 are reverse biased and thus no leakage current flow through the switches M66, M71, M72, M73.

In addition, since the control end of the switch M22 is coupled to the next driving stage and configured for receiving the next stage driving signal k[N+9], the control end of the switch M22 receives the driving clock signal that is at the low level (i.e., the level of the reference voltage Vss3) through the driving signal output terminal (e.g., the output terminal OT1 or OT2) of the next driving stage and the activated switch (e.g., the switch M3 or M4), such that the voltage of the control end of the switch M22 is the reference voltage Vss3 and less than the reference voltage Vss2 coupled to the one end of the switch M22, thus resulting in that the switch M22 is also reverse biased and thus no leakage current flow through the switch M22.

At time t1, the driving clock signal CCK1 rises from the low level to the high level, such that the voltage of the terminal B1[N] is pushed up to a higher level through the coupling effect generated by the switch M3 according to the driving clock signal CCK1, and the driving clock signal CCK1 is transmitted through the switch M3 to the output terminal OT1 and outputted as the present stage driving signal k[N]. At that moment, the voltage of the node Q is pulled down to the reference voltage Vss3 such that the switch M7 is deactivated, and the driving clock signal CCK4 is still at the low level such that the output terminal OT2 is rendered not outputting the signal, such that the switch M7 has a leakage current path therein, thus resulting in that the voltage of the terminal B1[N] decreases gradually for the period 3H after the time t1 and then is pushed up to a further higher voltage level till the time t4. Similarly, the voltage of the terminal B1[N+3] of the next driving stage (e.g., the terminal B1[N+3] of the second driving stage as shown in FIG. 6B) also decreases.

Taking the first driving stage and the second driving stage respectively shown in FIG. 6A and FIG. 6B as an example and referring to FIG. 8 at the same time, the driving clock signals CCK1 and CCK4 received by the first driving stage have the phase difference of the period 3H, and the driving clock signals CCK4 and XCCK1 received by the second driving stage have the phase difference of the period 3H, such that the voltage variance of the terminal B1[N+3] of the second driving stage has a phase delay of the period 3H relative to the voltage variance of the terminal B1[N] of the first driving stage. Thus, the decrease of the voltage of the terminal B1[N+3], due to the leakage current, can be compensated by the voltage of the terminal B1[N] during the period between time t4 and time t5, and the rest of the driving stages may be deduced by analogy. Therefore, the terminal B1 in the cascade-connected driving stages can be compensated in operation, so as to prevent the driving capability from being deteriorated due to the leakage current.

In addition, at time t1, the gate clock signal CK1 also rises from the low level to the high level, such that the voltage of the terminal B2[N] is pushed up to a higher level through the coupling effect generated by the switch M33 according to the gate clock signal CK1, and the gate clock signal CK1 is transmitted through the switch M33 to the output terminal OUT1 and outputted as the present stage gate signal G[N].

At time t2, the gate clock signal CK2 rises from the low level to the high level, such that the voltage of the terminal B2[N] is pushed up to a further higher level through the coupling effect generated by the switch M44 according to the gate clock signal CK2, and the gate clock signal CK2 is transmitted through the switch M44 to the output terminal OUT2 and outputted as the next stage gate signal G[N+1].

At time t3, the gate clock signal CK3 rises from the low level to the high level, such that the voltage of the terminal B2[N] is pushed up to a even further higher level through the coupling effect generated by the switch M55 according to the gate clock signal CK3, and the gate clock signal CK3 is transmitted through the switch M55 to the output terminal OUT3 and outputted as the further next stage gate signal G[N+2].

At time t4, the driving clock signal CCK4 rises from the low level to the high level, such that the voltage of the terminal B1[N] is pushed up to a further higher level till time t5 through the coupling effect generated by the switch M4 according to the driving clock signal CCK4, and the driving clock signal CCK4 is transmitted through the switch M4 to the output terminal OT2 and outputted as the next stage driving signal k[N+3].

Thereafter, at time t5, time t6, and time t7, the driving clock signal CCK1 and the gate clock signals CK1, CK2, CK3 correspondingly fall from the high level to the low level, such that the voltages of the terminals B1[N] and B2[N] decrease to lower levels accordingly. Then, at time t8, the switches M1 and M11 are deactivated such that the voltages of the terminals B1[N] and B2[N] decrease to the original low level.

On the other hand, after the driving stage 500 outputs the driving signals k[N], k[N+3] and the gate signals G[N], G[N+1], G[N+2], the switches M1 and M11 are deactivated, the switches M2 and M22 receive the next stage driving signal k[N+9] and are activated accordingly, such that the voltages of the terminals B1[N] and B2[N] are pulled down to the reference voltage Vss2, the switches M3, M4, M33, M44, M55 are accordingly deactivated, and the switch M5 is also deactivated accordingly. When the driving clock signal CCK1 rises from the low level to the high level again, the voltage of the node Q is pulled up to the high level through the device M10 according to the driving clock signal CCK1, such that the pull-down control signal A[N] is generated accordingly, thus resulting in that the switches M7, M8 both are activated to pull down the terminal B1[N] and the output terminal OT2 to the reference voltage Vss3, and that the switches M66, M71, M72, M73 are activated to pull down the terminal B2[N] to the reference voltage Vss2 and to pull down the output terminals OUT1, OUT2, OUT3 to the reference voltage Vss1, so as to perform operations of voltage stabilization for the aforementioned terminals.

The control end of the switch M11 is coupled to the previous driving stage and configured for receiving the previous stage driving signal k[N−3], and thus the control end of the switch M11 receives the driving clock signal that is at the low level (i.e., the reference voltage Vss3) through the driving signal output terminal (e.g., the output terminal OT1 or OT2) and the activated switch (e.g., the switch M3 or M4) in the previous driving stage, and the level of the control end of the switch M11 is the reference voltage Vss3 that is less than the level (i.e., the reference voltage Vss2) of one end (i.e., terminal B2[N]) of the switch M11, such that the switch M11 is reverse biased and no leakage current flow through the switch M11.

In addition, the levels of the control ends (i.e., the terminal B2[N]) of the switches M33, M44, M55 are the reference voltage Vss2 that is less than the levels (i.e., the reference voltage Vss1) of respective ends (i.e., the output terminals OUT1, OUT2, OUT3) of the switches M33, M44, M55, and thus the switches M33, M44, M55 are also reverse biased and no leakage current flow through the switches M33, M44, M55, and there is no tendency of interference noises affecting the switches M33, M44 and M55 which cause fluctuations at the output terminals OUT1, OUT2 and OUT3.

As mentioned above, when the second shift register circuit 502 stops operating, all of the switches are reverse biased, and thus there is no tendency of the leakage current flowing through the switches, such that there is no tendency of interference noises affecting the entire circuit and the output signals, and the required voltage stabilizing circuit or device can be reduced significantly, so as to further decrease the required power consumption and the circuit layout area.

Figure 9:
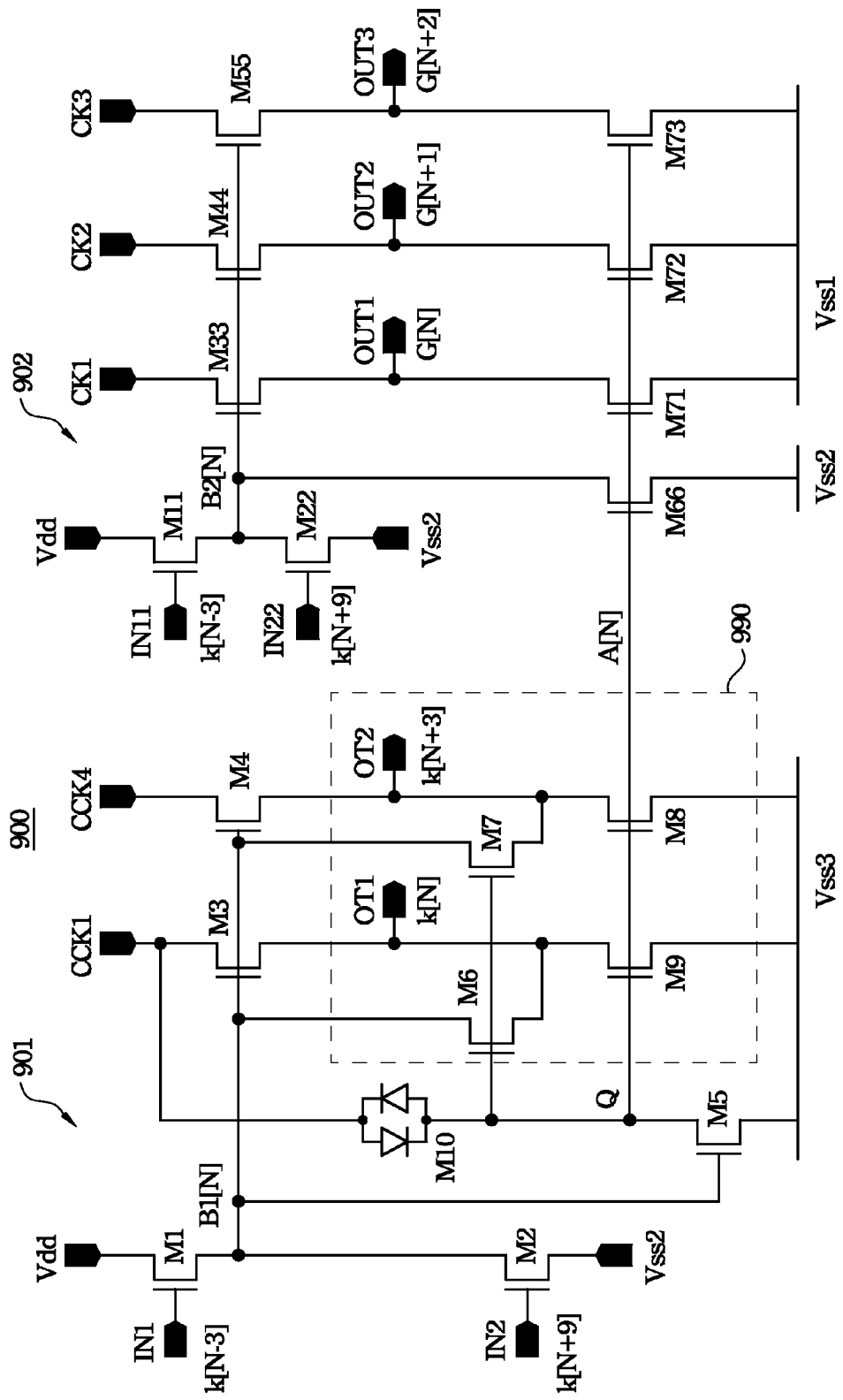
FIG. 9 is a circuit diagram illustrating a driving stage according to still another embodiment of the present invention.

FIG. 9 is a circuit diagram illustrating a driving stage according to still another embodiment of the present invention. The driving stage 900 is applicable to the gate driver 300 as shown in FIG. 3. The driving stage 900 includes a first shift register circuit 901 and a second shift register circuit 902, in which the second shift register circuit 902 is electrically coupled to the first shift register circuit 901, the elements or switches included in the first shift register circuit 901 and the second shift register circuit 902 and the connections and operations thereof are similar to the embodiment as shown in FIG. 5, and thus they are not described in further detail herein.

Furthermore, in the embodiment as shown in FIG. 9, a first pull-down unit 990 includes the switches M6, M7 and M8, in which the connections and operations of the switches M6, M7 and M8 with other devices are similar to the embodiment as shown in FIG. 5, and thus they are not described in further detail herein. Compared to the embodiment as shown in FIG. 5, the first pull-down unit 990 may further include a switch M9, a control end of the switch M9 is electrically coupled to the switch M5 at the node Q, one end of the switch M9 is electrically coupled to the present stage driving signal output terminal OT1, and the other end of the switch M9 is configured to be electrically coupled to the reference voltage Vss3, in which the switch M9 is activated according to the pull-down control signal A[N], for electrically coupling the present stage driving signal output terminal OT1 to the reference voltage Vss3.

The operation of the driving stage 900 as shown in FIG. 9 is similar to the embodiment as shown in FIG. 5, and one of the differences between the two embodiments is that the additional switch M9 performs the operation of voltage stabilization for the terminal OT1.

As mentioned above, compared to the embodiment as shown in FIG. 6, in the condition that the driving stage 900 as shown in FIG. 9 is applied in the gate driver, the additional switch M9 performs the operation of voltage stabilization for the terminal OT1 in each driving stage.

In practice, the aforementioned switches can separately be implemented by various types of switches such as an analog switch, a digital switch, a transistor switch, a thin-film transistor (TFT) switch, etc.

Figure 10:
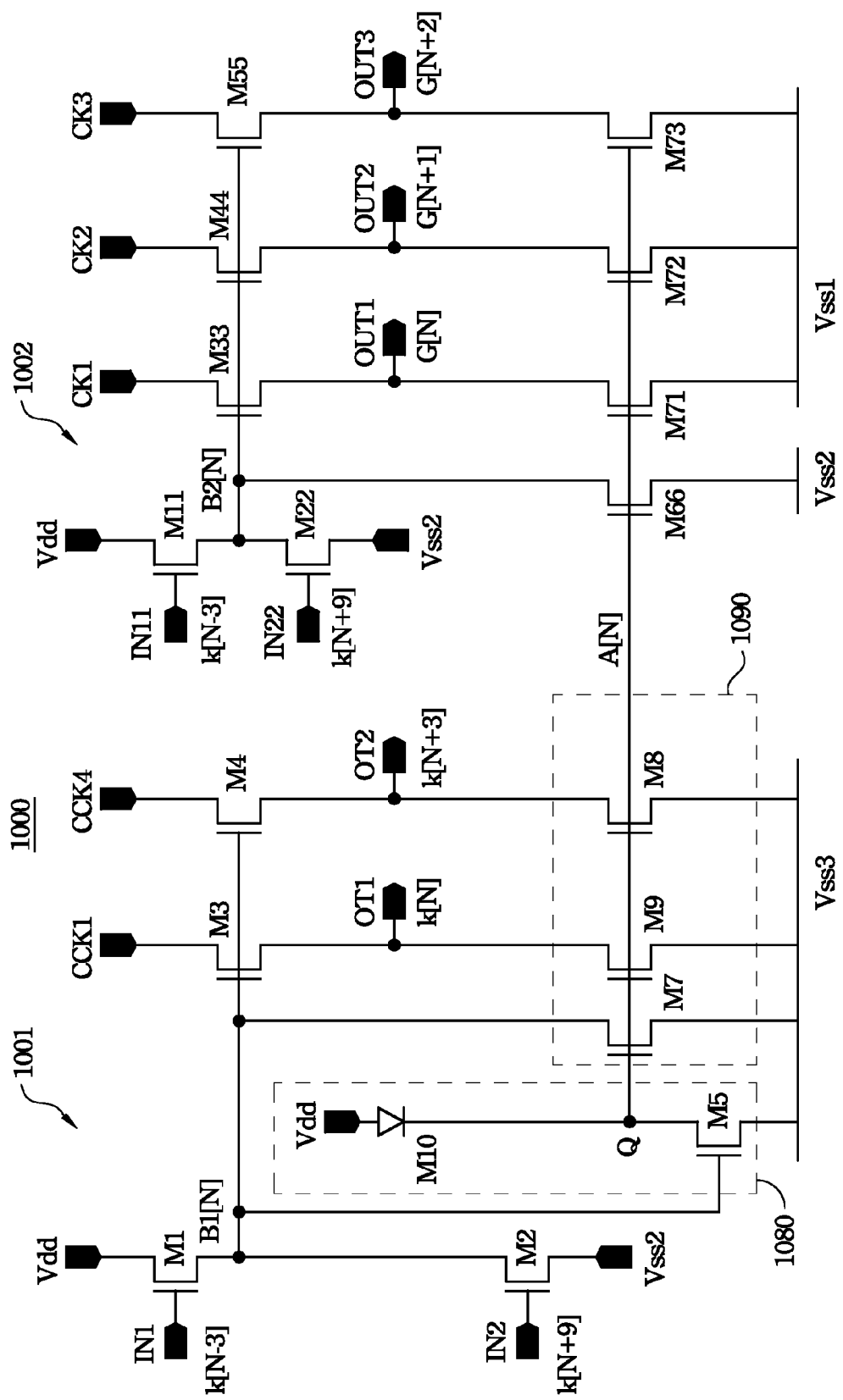
FIG. 10 is a circuit diagram illustrating a driving stage according to yet another embodiment of the present invention.

FIG. 10 is a circuit diagram illustrating a driving stage according to yet another embodiment of the present invention. The driving stage 1000 is applicable to the gate driver 300 as shown in FIG. 3. The driving stage 1000 includes a first shift register circuit 1001 and a second shift register circuit 1002, in which the second shift register circuit 1002 is electrically coupled to the first shift register circuit 1001, the elements or switches included in the first shift register circuit 1001 and the second shift register circuit 1002 and the connections and operations thereof are similar to the embodiment as shown in FIG. 9, and thus they are not described in further detail herein.

Compared to the embodiment as shown in FIG. 9, a pull-down control unit 1080 in the embodiment as shown in FIG. 10 further includes the switch M5, in which the control end of the switch M5 is electrically coupled to the first control signal output terminal B1[N], one end (i.e., the node Q) of the switch M5 is configured to be electrically coupled to the power voltage Vdd through the device M10, and the other end of the switch M5 is configured to be electrically coupled to the reference voltage Vss3. In operation, the switch M5 is controlled with the control signal representing the voltage of B1[N], and the switch M5 is activated when the voltage of the first control signal output terminal B1[N] is at the high level, such that the node Q has the voltage level of the reference voltage Vss3, and the pull-down control A[N] is at the low level. On the other hand, when the voltage of the first control signal output terminal B1[N] is at the low level, the switch M5 is deactivated, such that the power voltage Vdd is outputted from the pull-down control unit 1080 as the pull-down control A[N].

Furthermore, compared to the embodiment as shown in FIG. 9, a first pull-down unit 1090 in the embodiment as shown in FIG. 10 includes the switches M7, M8 and M9. The control end of the switch M8 is electrically coupled to the switch M5 at the node Q, one end of the switch M8 is electrically coupled to the next stage driving signal output terminal OT2, and the other end of the switch M8 is configured to be electrically coupled to the reference voltage Vss3, in which the switch M8 is activated according to the pull-down control signal A[N], for electrically coupling the next stage driving signal output terminal OT2 to the reference voltage Vss3. Moreover, the control end of the switch M9 is electrically coupled to the switch M5 at the node Q, one end of the switch M9 is electrically coupled to the present stage driving signal output terminal OT1, and the other end of the switch M9 is configured to be electrically coupled to the reference voltage Vss3, in which the switch M9 is activated according to the pull-down control signal A[N], for electrically coupling the present stage driving signal output terminal OT1 to the reference voltage Vss3. In addition, the control end of the switch M7 is electrically coupled to the switch M5 at the node Q, one end of the switch M7 is electrically coupled to the terminal B1[N], and the other end of the switch M7 is configured to be electrically coupled to the reference voltage Vss3, in which the switch M7 is activated according to the pull-down control signal A[N], for electrically coupling the terminal B1[N] to the reference voltage Vss3.

The operation of the driving stage 1000 as shown in FIG. 10 is similar to the embodiment as shown in FIG. 9, and one of the differences between the two embodiments is that the switch M7 in the driving stage 1000 performs the operation of voltage stabilization for the terminal B1[N].

As mentioned above, compared to the embodiment as shown in FIG. 6, in the condition that the driving stage 1000 as shown in FIG. 10 is applied in the gate driver, the switch M7 performs the operation of voltage stabilization for the terminal B1[N] in each driving stage.

In practice, the aforementioned switches can separately be implemented by various types of switches such as an analog switch, a digital switch, a transistor switch, a thin-film transistor (TFT) switch, etc.

Figure 11:
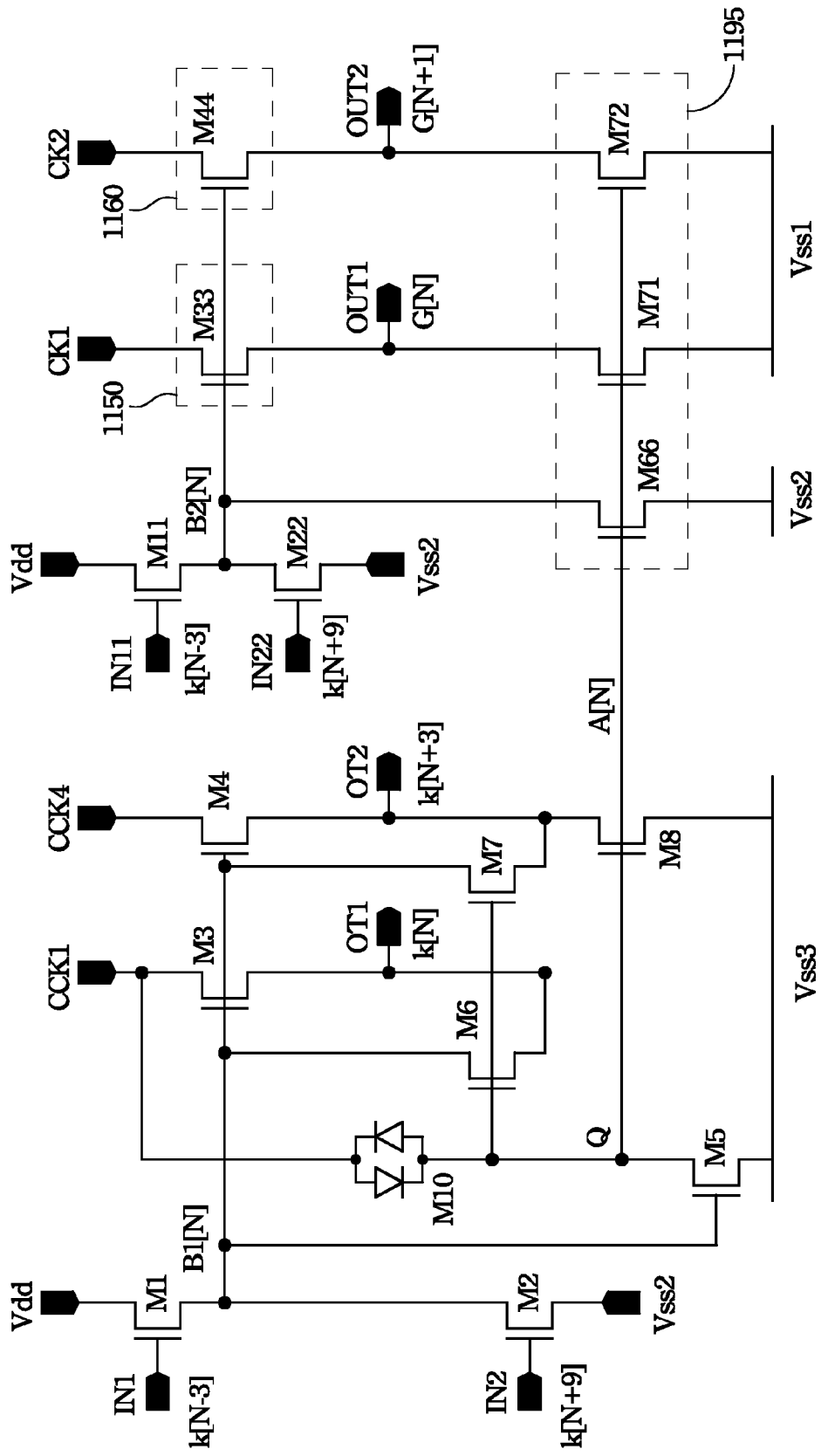
FIG. 11 is a circuit diagram illustrating a driving stage according to still yet another embodiment of the present invention.

FIG. 11 is a circuit diagram illustrating a driving stage according to still yet another embodiment of the present invention. The driving stage 1100 is applicable to the gate driver 300 as shown in FIG. 3. The driving stage 1100 includes a first shift register circuit 1101 and a second shift register circuit 1102, in which the second shift register circuit 1102 is electrically coupled to the first shift register circuit 1101, the elements or switches included in the first shift register circuit 1101 and the second shift register circuit 1102 and the connections and operations thereof are similar to the embodiment as shown in FIG. 5, and thus they are not described in further detail herein.

Compared to the embodiment as shown in FIG. 5, the second shift register circuit 1102 in the embodiment as shown in FIG. 11 is configured for outputting the present stage gate signal G[N] and the next stage gate signal G[N+1] but not outputting the other next stage gate signal G[N+2].

Specifically, in addition to including the switches M11 and M22, the second shift register circuit 1102 as shown in FIG. 11 further includes a first output unit 1150, a second output unit 1160 and a second pull-down unit 1195. The first output unit 1150 is configured for receiving the gate clock signal CK1, the first output unit 1150 operates according to the gate clock signal CK1 and the control signal representing the voltage of B2[N], and the first output unit 1150 outputs the present stage gate signal G[N] at the present stage gate signal output terminal OUT1. The second output unit 1160 is configured for receiving the gate clock signal CK2, the second output unit 1160 operates according to the gate clock signal CK2 and the control signal representing the voltage of B2[N], and the second output unit 1160 outputs the next stage gate signal G[N+1] at the next stage gate signal output terminal OUT2. The second pull-down unit 1195 is electrically coupled to the gate signal output terminals OUT1 and OUT2 and is activated according to the pull-down control signal A[N], for electrically coupling the gate signal output terminals OUT1 and OUT2 to the reference voltage Vss1, so as to perform the operation of voltage stabilization for the gate signal output terminals OUT1 and OUT2.

In one embodiment, the first output unit 1150 may include the switch M33, and the second output unit 1160 may include the switch M44. The control end of the switch M33 is electrically coupled to the second control signal output terminal B2[N], one end of the switch M33 is configured for receiving the gate clock signal CK1, and the other end of the switch M33 is electrically coupled to the present stage gate signal output terminal OUT1, in which the switch M33 operates according to the control signal representing the voltage of B2[N] to output the gate clock signal CK1 as the present stage gate signal G[N]. Moreover, the control end of the switch M44 is electrically coupled to the second control signal output terminal B2[N], one end of the switch M44 is configured for receiving the gate clock signal CK2, and the other end of the switch M44 is electrically coupled to the next stage gate signal output terminal OUT2, in which the switch M44 operates according to the control signal representing the voltage of B2[N] to output the gate clock signal CK2 as the next stage gate signal G[N+1].

In another embodiment, the second pull-down unit 1195 may include the switches M71, M72 and M66. The control end of the switch M71 is electrically coupled to the switch M5 at the node Q, one end of the switch M71 is electrically coupled to the present stage gate signal output terminal OUT1, and the other end of the switch M71 is electrically coupled to the reference voltage Vss1, in which the switch M71 is activated according to the pull-down control signal A[N], for electrically coupling the present stage gate signal output terminal OUT1 to the reference voltage Vss1. The control end of the switch M72 is electrically coupled to the switch M5 at the node Q, one end of the switch M72 is electrically coupled to the next stage gate signal output terminal OUT2, and the other end of the switch M72 is electrically coupled to the reference voltage Vss1, in which the switch M72 is activated according to the pull-down control signal A[N], for electrically coupling the next stage gate signal output terminal OUT2 to the reference voltage Vss1. The control end of the switch M66 is electrically coupled to the switch M5 at the node Q, one end of the switch M66 is electrically coupled to the second control signal output terminal B2[N], and the other end of the switch M66 is electrically coupled to the reference voltage Vss2, in which the switch M66 is activated according to the pull-down control signal A[N], for electrically coupling the second control signal output terminal B2[N] to the reference voltage Vss2, in which the reference voltage Vss1 is greater than the reference voltage Vss2, and the reference voltage Vss2 is greater than the reference voltage Vss3.

As described above in the embodiments of the present invention, the aforementioned display panel and the gate driver can be applied such that a plurality of gate signals are outputted by a single driving stage (for example, three gate signals are sequentially outputted to three gate lines, respectively) so as to reduce the number of the stages required by the gate driver, and the switches in the gate driver are reverse biased when the switches stop operating, thereby isolating the leakage current path and preventing the leakage current from being generated.

In addition, there is no tendency for the leakage current generated in the driving stages of the gate driver, and thus the driving stages can retain the better driving capability, and there is no tendency of the interference noises affecting the entire circuit and the output signals, such that the required voltage stabilizing circuit or device can be reduced significantly, so as to further decrease the required power consumption and the circuit layout area.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded with the broadest interpretation so as to encompass all such modifications and similar structures.

What is claimed is:

1. A gate driver comprising a plurality of cascade-connected driving stages, each of the driving stages comprising:
   a first shift register circuit comprising:
   a first input unit for outputting a first control signal according to a previous stage driving signal;
   a first drive output unit for outputting a present stage driving signal according to the first control signal and a first driving clock signal; and
   a second drive output unit for outputting a next stage driving signal according to the first control signal and a second driving clock signal; and
   a second shift register circuit electrically coupled to the first shift register circuit, the second shift register circuit comprising:
   a second input unit for outputting a second control signal according to the previous stage driving signal;
   a first output unit for outputting a present stage gate signal according to the second control signal and a first gate clock signal;
   a second output unit for outputting a first next stage gate signal according to the second control signal and a second gate clock signal; and
   a third output unit for outputting a second next stage gate signal according to the second control signal and a third gate clock signal,
   wherein the first driving clock signal and the second driving clock signal have a high voltage level of a power voltage and a low voltage level of a first reference voltage, and the first gate clock signal, the second gate clock signal and the third gate clock signal have a high voltage level of the power voltage and a low voltage level of a second reference voltage, wherein the second reference voltage is greater than the first reference voltage.

2. The gate driver as claimed in claim 1, wherein the first shift register circuit further comprises:
   a pull-down control unit controlled with the first control signal to output a pull-down control signal according to the first driving clock signal or a power voltage.

3. The gate driver as claimed in claim 2, wherein the first shift register circuit further comprises:
   a first pull-down unit for electrically coupling a present stage driving signal output terminal and a next stage driving signal output terminal to the first reference voltage according to the pull-down control signal.

4. The gate driver as claimed in claim 3, wherein the first pull-down unit further comprises:
- a first switch for electrically coupling a first control signal output terminal to the present stage driving signal output terminal according to the pull-down control signal;
- a second switch for electrically coupling the first control signal output terminal to the next stage driving signal output terminal according to the pull-down control signal; and
- a third switch for electrically coupling the next stage driving signal output terminal to the first reference voltage according to the pull-down control signal.

5. The gate driver as claimed in claim 4, wherein the first pull-down unit further comprises:
- a fourth switch for electrically coupling the present stage driving signal output terminal to the first reference voltage according to the pull-down control signal.

6. The gate driver as claimed in claim 3, wherein the first pull-down unit further comprises:
- a first switch for electrically coupling a first control signal output terminal to the first reference voltage according to the pull-down control signal;
- a second switch for electrically coupling the present stage driving signal output terminal to the first reference voltage according to the pull-down control signal; and
- a third switch for electrically coupling the next stage driving signal output terminal to the first reference voltage according to the pull-down control signal.

7. The gate driver as claimed in claim 1, wherein the second shift register circuit further comprises:
- a second pull-down unit for electrically coupling a present stage gate signal output terminal, a first next stage gate signal output terminal and a second next stage gate signal output terminal to the second reference voltage according to the pull-down control signal;
- wherein the second reference voltage is greater than the first reference voltage.

8. The gate driver as claimed in claim 7, wherein the second pull-down unit further comprises:
- a first switch for electrically coupling the present stage gate signal output terminal to the second reference voltage according to the pull-down control signal;
- a second switch for electrically coupling the first next stage gate signal output terminal to the second reference voltage according to the pull-down control signal;
- a third switch for electrically coupling the second next stage gate signal output terminal to the second reference voltage according to the pull-down control signal; and
- a fourth switch for electrically coupling a second control signal output terminal to a third reference voltage according to the pull-down control signal.

9. The gate driver as claimed in claim 1, wherein the first input unit further comprises:
- a first switch for electrically coupling a power voltage to a first control signal output terminal according to the previous stage driving signal; and
- a second switch for electrically coupling a third reference voltage to the first control signal output terminal according to a first next stage driving signal;
the second input unit further comprises:
- a third switch for electrically coupling the power voltage to a second control signal output terminal according to the previous stage driving signal; and
- a fourth switch for electrically coupling the third reference voltage to the second control signal output terminal according to the first next stage driving signal;
wherein the second reference voltage is greater than the third reference voltage, and the third reference voltage is greater than the first reference voltage.

10. The gate driver as claimed in claim 1, wherein
the first drive output unit further comprises a first switch for transmitting the first driving clock signal as the present stage driving signal according to the first control signal; and
the second drive output unit further comprises a second switch for transmitting the second driving clock signal as the next stage driving signal according to the first control signal.

11. The gate driver as claimed in claim 1, wherein the first output unit further comprises a first switch for transmitting the first gate clock signal as the present stage gate signal according to the second control signal;
the second output unit further comprises a second switch for transmitting the second gate clock signal as the first next stage gate signal according to the second control signal; and
the third output unit further comprises a third switch for transmitting the third gate clock signal as the second next stage gate signal according to the second control signal.

12. The gate driver as claimed in claim 1, wherein the first driving clock signal and the second driving clock signal have a phase difference of one-quarter period, the first gate clock signal, the second gate clock signal and the third gate clock signal have phases that are different from one another, and the first driving clock signal and the first gate clock signal have a same phase.

13. A display panel comprising:
- a plurality of data lines;
- a plurality of gate lines interlacing with the data lines; and
- a gate driver coupled to the gate lines and configured for outputting a plurality of gate signals sequentially to the gate lines, wherein the gate driver comprises a plurality of cascade-connected driving stages, and each of the driving stages comprises:
  - a first input unit for electrically coupling a power voltage to a first control signal output terminal according to a previous stage driving signal or for electrically coupling a first reference voltage to the first control signal output terminal according to a next stage driving signal;
  - a first switch for outputting a first driving clock signal as a present stage driving signal according to a voltage level of the first control signal output terminal;
  - a second switch for outputting a second driving clock signal as a second next stage driving signal according to the voltage level of the first control signal output terminal;
  - a second input unit for electrically coupling the power voltage to a second control signal output terminal according to the previous stage driving signal or for electrically coupling the first reference voltage to the second control signal output terminal according to the next stage driving signal;
  - a third switch for outputting a first gate clock signal as a present stage gate signal according to a voltage level of the second control signal output terminal;
  - a first pull-down unit for electrically coupling a present stage driving signal output terminal and a second next stage driving signal output terminal to a second reference voltage according to a pull-down control signal; and a second pull-down unit for electrically coupling a present stage gate signal output terminal, a first next stage gate signal output terminal and a second next stage gate signal output terminal to a third reference voltage according to the pull-down control signal;

wherein the third reference voltage is greater than the first reference voltage, and the first reference voltage is greater than the second reference voltage.

14. The display panel as claimed in claim 13, wherein each of the driving stages further comprises:

a fourth switch for outputting a second gate clock signal as a first next stage gate signal according to the voltage level of the second control signal output terminal; and a fifth switch for outputting a third gate clock signal as a second next stage gate signal according to the voltage level of the second control signal output terminal.

15. The display panel as claimed in claim 14, wherein the first pull-down unit further comprises:

a sixth switch for electrically coupling the first control signal output terminal to the present stage driving signal output terminal according to the pull-down control signal;

a seventh switch for electrically coupling the first control signal output terminal to the second next stage driving signal output terminal according to the pull-down control signal; and an eighth switch for electrically coupling the second next stage driving signal output terminal to the second reference voltage according to the pull-down control signal.

16. The display panel as claimed in claim 14, wherein the first pull-down unit further comprises:

a sixth switch for electrically coupling the first control signal output terminal to the second reference voltage according to the pull-down control signal;

a seventh switch for electrically coupling the present stage driving signal output terminal to the second reference voltage according to the pull-down control signal; and an eighth switch for electrically coupling the second next stage driving signal output terminal to the second reference voltage according to the pull-down control signal.

17. The display panel as claimed in claim 14, wherein the second pull-down unit further comprises:

a sixth switch for electrically coupling the present stage gate signal output terminal to the third reference voltage according to the pull-down control signal;

a seventh switch for electrically coupling the first next stage gate signal output terminal to the third reference voltage according to the pull-down control signal;

an eighth switch for electrically coupling the second next stage gate signal output terminal to the third reference voltage according to the pull-down control signal; and a ninth switch for electrically coupling the second control signal output terminal to the first reference voltage according to the pull-down control signal.

18. The display panel as claimed in claim 14, wherein the first driving clock signal and the second driving clock signal have a high voltage level of the power voltage and a low voltage level of the second reference voltage, and the first gate clock signal, the second gate clock signal and the third gate clock signal have a high voltage level of the power voltage and a low voltage level of the third reference voltage.

* * * * *